United States Patent
Hiers et al.

(10) Patent No.: US 10,911,323 B2
(45) Date of Patent: Feb. 2, 2021

(54) SYSTEM-ON-CHIP (SOC) ASSEMBLY, CONFIGURABLE IP GENERATION AND IP INTEGRATION UTILIZING DISTRIBUTED COMPUTER SYSTEMS

(71) Applicant: TEXAS INSTRUMENTS INCORPORATED, Dallas, TX (US)

(72) Inventors: Todd Christopher Hiers, Houston, TX (US); Chunhua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 250 days.

(21) Appl. No.: 15/878,978

(22) Filed: Jan. 24, 2018

(65) Prior Publication Data

US 2018/0212839 A1   Jul. 26, 2018

Related U.S. Application Data

(60) Provisional application No. 62/449,817, filed on Jan. 24, 2017.

(51) Int. Cl.
*G06F 3/00* (2006.01)
*H04L 12/24* (2006.01)
(Continued)

(52) U.S. Cl.
CPC ............ *H04L 41/22* (2013.01); *G06F 3/0483* (2013.01); *G06F 3/0486* (2013.01); *G06F 30/30* (2020.01); *H04L 41/12* (2013.01)

(58) Field of Classification Search
CPC .. G06F 3/0483; G06F 3/0486; G06F 17/5045; G06F 3/0481; H04L 41/22
See application file for complete search history.

(56) References Cited

U.S. PATENT DOCUMENTS 8,296,170 B2 * 10/2012 O'Brien ............. G06Q 10/0631
  705/7.12
8,484,578 B2 * 7/2013 Gordner ............. G06F 3/04845
  715/808

(Continued)

*Primary Examiner* — Nicholas Augustine
(74) *Attorney, Agent, or Firm* — Brian D. Graham; Charles A. Brill; Frank D. Cimino

(57) ABSTRACT

An architecture-specific web-based executable specification tool maintains specification information and metadata for chip and system on a chip (SoC) design. Metadata available in the development ecosystem may be leveraged to improve the specification-to-design process. A unified, integrated environment for subsystem creation, SoC integration, and SoC specification teams is presented using a tool that comprehends SoC constructs. A modern web-based framework (not stand-alone tool) provides collaboration capabilities and allows visual representation and manipulation of data. Connection fabrics (e.g., network on a chip (NoC)) and other project-specific infrastructure can be configured and synthesized on demand and brought in to the design using the common environment. Netlists and other connectivity data can be fed into automated RTL generation processes directly, or used as a reference for implementation design teams. Reports and automated software generation satisfy the needs of the design verification and software teams. Functional and performance testing feedback loops are also provided.

25 Claims, 16 Drawing Sheets

(51) Int. Cl.
*G06F 3/0483* (2013.01)
*G06F 3/0486* (2013.01)
*G06F 30/30* (2020.01)
*G06F 3/01* (2006.01)

(56) References Cited

U.S. PATENT DOCUMENTS

| | | | |
|---|---|---|---|
| 9,418,356 B2* | 8/2016 | Crevier | G06Q 10/107 |
| 9,715,534 B2* | 7/2017 | Beausoleil | H04L 51/36 |
| 10,007,405 B2* | 6/2018 | D'Amore | G06F 3/0484 |
| 2007/0156670 A1* | 7/2007 | Lim | G06F 9/468 |
| 2013/0019028 A1* | 1/2013 | Myers | G06Q 10/103 |
| | | | 709/246 |
| 2013/0227503 A1* | 8/2013 | Tai | G06F 30/39 |
| | | | 716/103 |
| 2015/0154677 A1* | 6/2015 | Banerjee | G06Q 30/0621 |
| | | | 705/26.35 |
| 2015/0310188 A1* | 10/2015 | Ford | H04L 63/0428 |
| | | | 726/28 |
| 2015/0339570 A1* | 11/2015 | Scheffler | G06N 3/04 |
| | | | 706/16 |

* cited by examiner

| Module | Instance | Rev | ProjectB |
|---|---|---|---|
| adc12_gs80 ⊗ | mcu_0 | 1.0.3.5 | Y |
| adc12_gs80 ⊗ | mcu_1 | 1.0.3.5 | Y |
| atl ⊗ | main_0 | -1.160210.152608.0 | Y |
| cal ⊗ | main_0 | 1.0.1.0 | Y |
| cal ⊗ | main_1 | 1.0.1.0 | Y |
| compute_cluster_ProjectA_tb_vdc ⊗ | main_0 | -1.160609.144454.0 | Y |
| cpsw_2guss ⊗ | mcu_0 | 1.0.6.0 | Y |
| cpt2_aggregator32 ⊗ | main_0 | 1.1.0.0 | Y |
| cpt2_aggregator32 ⊗ | mcu_0 | 1.1.0.0 | Y |
| cpt2_probe_vbusm ⊗ | main_br2scrm14_3 | 1.0.4.0 | Y |

FIG. 7

| Address | Region | Sz |
|---|---|---|
| 0000 0000 | export_vbusp_32b_slv.wkup_0.slv.0.mmr | 16M |
| 0100 0000 | export_vbusm_32b_slv.wkup_0.slv.0.mmr | 16M |
| 0200 0000 | export_vbusm_32b_slv.wkup_0.slv.0.SoC Region1[SoC Region] ⊗ | 32M |
| 0400 0000 | export_vbusm_32b_slv.wkup_0.slv.0.SoC Region2[SoC Region] ⊗ | 64M |
| 0800 0000 | export_vbusm_32b_slv.wkup_0.slv.0.SoC Region3[SoC Region] ⊗ | 128M |
| 1000 0000 | export_vbusm_32b_slv.wkup_0.slv.0.SoC Region4[SoC Region] ⊗ | 256M |
| 2000 0000 | export_vbusm_32b_slv.wkup_0.slv.0.SoC Region5[SoC Region] ⊗ | 512M |
| 4000 0000 | export_vbusm_32b_slv.wkup_0.slv.0.SoC Region6[SoC Region] ⊗ | 32M |
| 4200 0000 | k3_wkup_psc_wrap.wkup_0.vbus.0.vbus | 4K |
| 4200 1000 | Reserved | 188K |
| 4201 0000 | k3_pll_ctrl_wrap.wkup_0.vbus_slv.0.mem | 512 |
| 4201 0200 | Reserved | 576K - 512 |
| 4208 0000 | esm_wkup.wkup_0.esm_cfg.0.CFG | 4K |
| 4208 1000 | Reserved | 700K |
| 4211 0000 | gpio_144.wkup_0.mmr_0.mem | 256 |
| 4211 0100 | Reserved | 192K - 256 |
| 4212 0000 | mshsi2c.wkup_0.vbusp.0.mem | 256 |
| 4212 0100 | Reserved | 1M - 256 |

FIG. 8

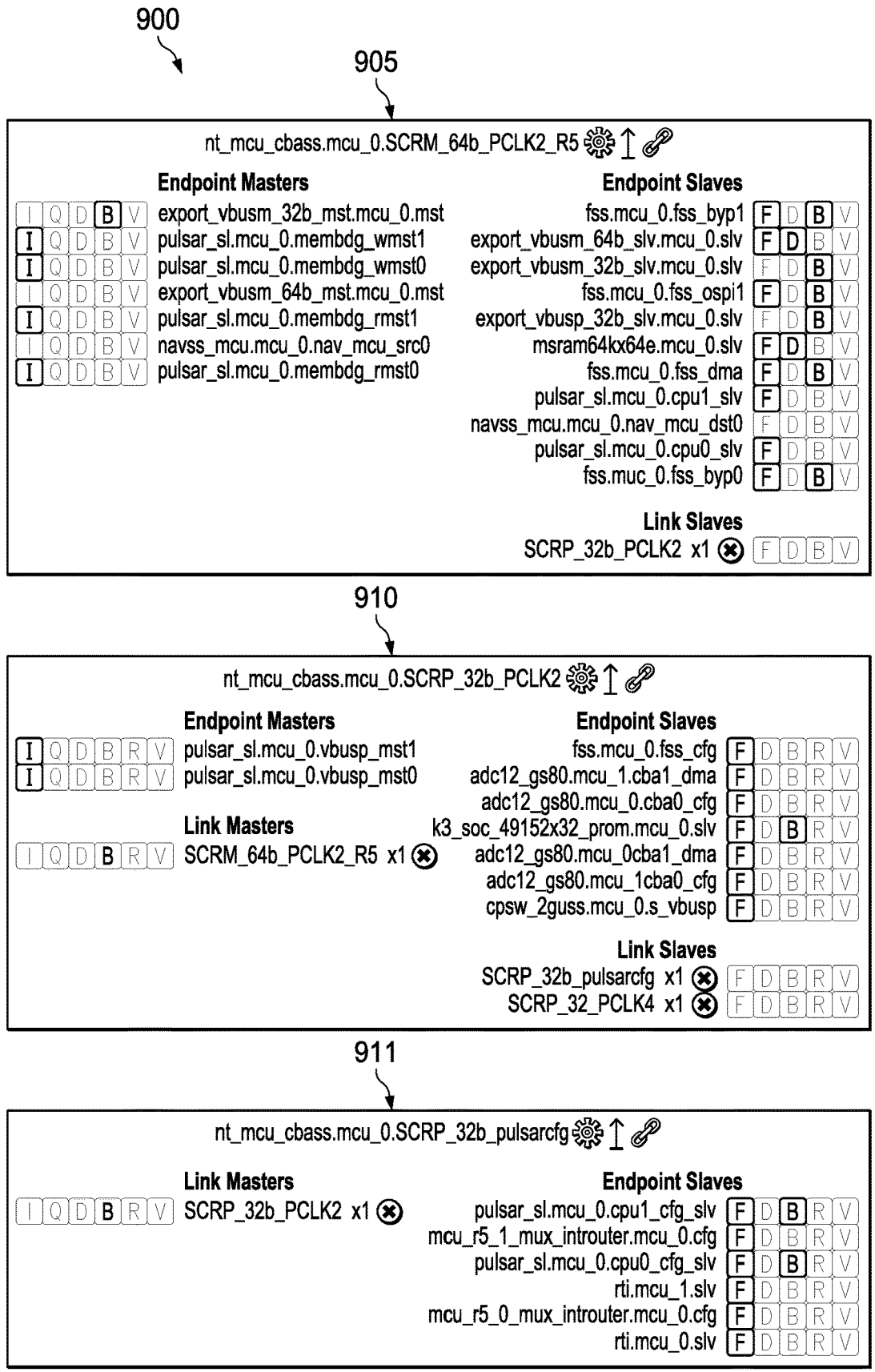
FIG. 9A1

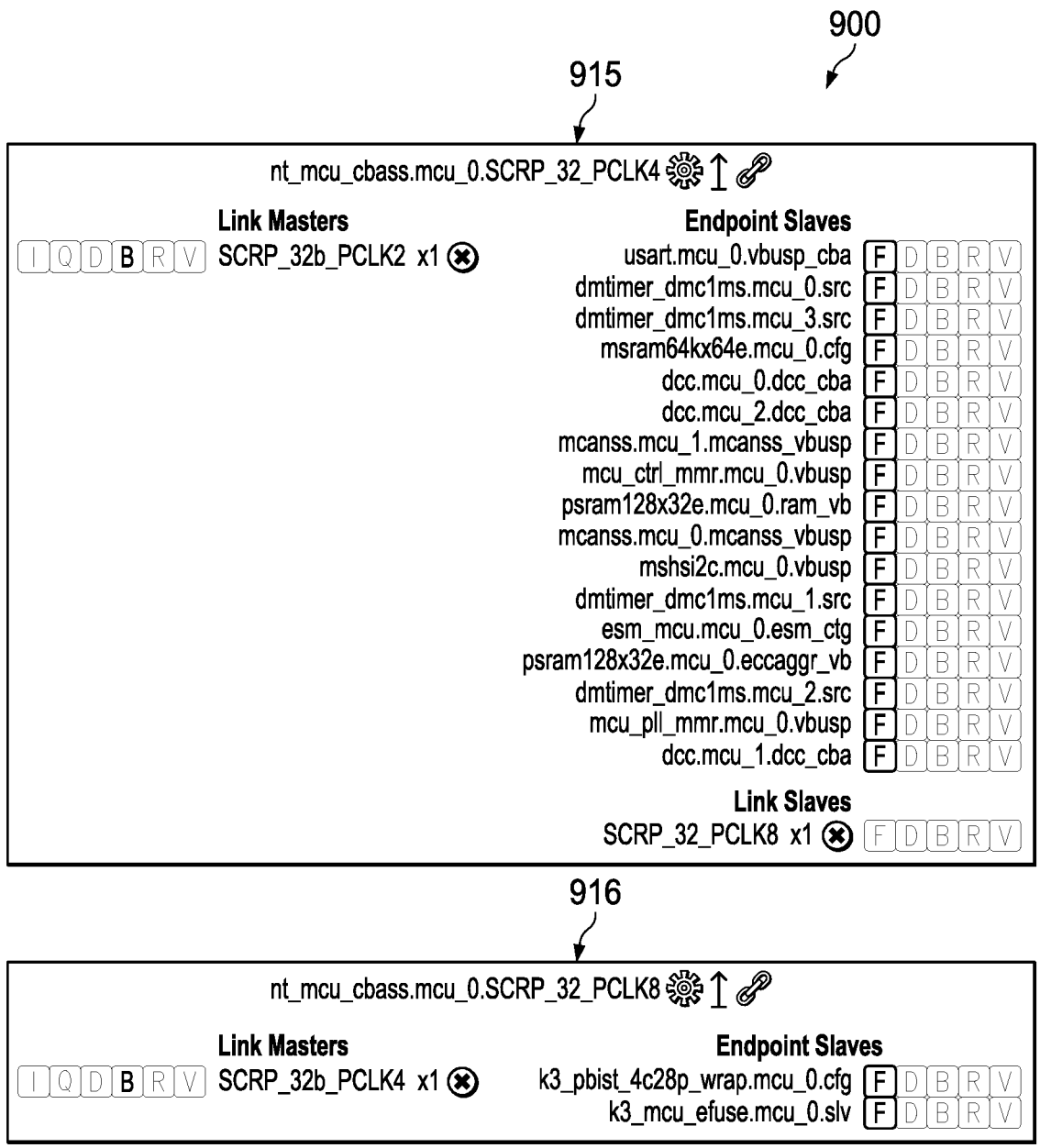
FIG. 9A2

SYSTEM-ON-CHIP (SOC) ASSEMBLY, CONFIGURABLE IP GENERATION AND IP INTEGRATION UTILIZING DISTRIBUTED COMPUTER SYSTEMS

RELATED APPLICATIONS

This application claims priority to U.S. Provisional Application No. 62/449,817 filed Jan. 24, 2017, which is hereby incorporated by reference in its entirety for all applicable purposes.

BACKGROUND

In electronic design, a semiconductor intellectual property ("IP") core (often referred to as an "IP core," or "IP block") references a reusable unit of logic, cell, or integrated circuit (commonly called a "chip") layout and design. It gets its name because it may refer to information that is the legal Intellectual Property of a particular party. In the context of this disclosure, IP will refer to the logic and/or metadata associated with design specifications of a chip or System on a Chip ("SoC"). Traditional SoC design involves multiple manual steps, which may be prone to introducing errors: first a system engineer manually enters IP information to form a textual front end system specification, and then designers read the text before entering the design details into one or more electronic design automation (EDA) tools. In general, system engineers utilize document processors such as text editors or document processing systems to produce and maintain textual specification data. These textual specifications may use a version control system designed for software development to assist in version tracking but the standard version control system does not have any built-in knowledge of the technical requirements for chip design.

Throughout the lifecycle of an SoC design process (e.g., requirements gathering, specification definition, coding and layout design, memory mapping, production and testing) parameters of an actual design are likely to change many times. In prior art systems, there is no mechanism to communicate changes or identify dependent components that are or may be affected by any particular change. As a result, the system engineer may not be aware of the recent IP changes (e.g., changes to metadata defining specifications for the logic on a chip). Further, a system designer may introduce typos in the specification process either at the beginning or throughout the development lifecycle. The designer could also misinterpret the design intent and make the wrong design. Any of the above mentioned errors (and others) may not be detected until the SoC is mass produced (e.g., fabricated) leading to considerable effort and money to fix.

Another problem with traditional SoC design flow is lack of coherent SoC data to produce correct SoC specific collaterals, such as SoC specific device drivers, tools, and customer documentation packages. In the prior art, those collaterals were commonly generated manually and somewhat asynchronously, possibly leading to inconsistencies with the actual SoC design. Further, for prior art systems it may be very difficult to check whether collaterals match the actual SoC design or not.

Commercial EDA software attempted to address some of these problems, helping to integrate modules consistently based on module metadata. But they did not address the co-design problem, and interfacing them to the existing module library and design ecosystem presents additional challenges. Furthermore, EDA tools were concerned with integrating existing modules, but creating SoC infrastructure (e.g. interrupt fabric and addressable interconnect) with the right architectural data for the generators is even more complex. These software packages often provide some capability for user-defined extensions, but could still represent a significant resource investment to get the customization needed. Simply put, off the shelf EDA tools (even with customization) do not present a viable solution to address the above identified issues.

The correct solution would be a custom "executable specification" tool that handled metadata-based module integration, helped with the co-design problem, could assist with the creation of SoC infrastructure, was architecture aware and integrated well with the existing EDA tools and flows. It should also simplify the data entry process, making the specification team's job easier. And support a collaborative specification effort, as the task is often split by domains of expertise across many team members. Disclosed examples describe multiple possible implementations and features of such a solution. The solution is collectively referred to as, "Virtual White Board" (VWB), in part because it should enable a team to "sketch" out a block diagram of a device as the basis for the specification, with prompts for detail as needed. Disclosed examples of VWB represent a comprehensive web based collaborative design tool to address the above problems by providing enhanced development communication, coordination, collateral information coordination (e.g., matching documentation), specification automation, and testing. A novel full cycle (feedback loop) testing implementation is also incorporated into VWB.

SUMMARY

In a first disclosed example, a computer-implemented method of integrated circuit (IC) chip design or a computer readable medium to configure a computer to perform a method of integrated circuit chip design is provided. This method may include: receiving an indication identifying a collaborative development project identifier for an integrated circuit at a design stage of a development lifecycle for the integrated circuit; obtaining information from one or more databases, the information including metadata for each of a set of associated IP modules included in the integrated circuit; processing the metadata for the set of associated IP modules to determine physical relationship information relative to location and interconnection on the integrated circuit for each IP module relative to other IP modules in the set of associated IP modules; presenting a graphical representation of at least a portion of the IC chip design on a graphical user interface communicatively coupled to a computer system; receiving an indication of change from the graphical user interface regarding the graphical representation; and storing updates to at least a portion of the metadata in the one or more database, the updates reflecting changes to attributes of the metadata consistent with the indication of change from the graphical user interface. Example 1 may be extended such that the indication of change from the graphical user interface represents an indication of change based on a drag and drop operation; the drag and drop operation represents an alteration of a memory map for at least one of the set of associated IP modules; the indication of change from the graphical user interface represents an indication of change reflecting addition of a module instance to the set of associated IP modules; and/or the indication of change from the graphical user interface represents changing a revision of a module instance from a first revision identifier to a second revision identifier in the set of associated IP modules.

Example one may also include analyzing changes in interfaces between a first revision of the module instance and the second revision of the module instance to identify changed interfaces and consistent interfaces; and presenting a dialog box emphasizing the changed interfaces. In some examples, emphasizing the changed interfaces comprises adding a visual clue to each of the changed interfaces in the dialog box; emphasizing the changed interfaces comprises not showing at least a portion of the consistent interfaces in the dialog box; and/or the changed interfaces are selected from the group consisting of: interrupts, inputs, outputs, power requirements, ports, and communication busses. Example 1 may also include generating a resistor transfer level (RTL) output representative of at least a portion of the integrated circuit; performing a validation test using the RTL output; and adjusting at least a portion of the metadata for the set of associated IP modules based on the validation test. Finally, example 1 may further include generating a comprehensive consistent set of collaterals representing the integrated circuit, the set of collaterals including at least resistor transfer level (RTL) output, software code, verification, and test information.

In a second example, an apparatus that includes a network communications interface; a memory; and one or more processing units, communicatively coupled to the memory and the network communications interface, wherein the memory stores instructions configured to cause the one or more processing units to: provide a collaborative development environment for one or more teams of end-users, the collaborative environment containing code modules designed to understand attributes of integrated circuit chip design; interface with one or more databases configured to store IP information and related metadata about a set of associated IP modules included in a collaborative development project; provide graphical information, via the network communication interface, pertaining to at least a portion of the set of associated IP modules to a display device associated with an end-user; receive information from the end-user relating to changes in functionality of at least one module from the set of associated IP modules; and provide an indication of the changes to members of a first team of the one or more teams of end-users, the first team not including the end-user. In this example, the indication of the changes may be an alert message containing information about the at least one module, the graphical user interface may be web based, and the integrated circuit chip may be a system on a chip (SoC) as opposed to a standard, possibly less complicated, IC.

BRIEF DESCRIPTION OF THE DRAWINGS

For a detailed description of various examples, reference will now be made to the accompanying drawings, in which:

FIG. 7 illustrates table 700 representing a sample SoC IP contents list (e.g., bill of materials "BOM"), according to one or more disclosed implementations;

FIG. 8 illustrates table 800 representing a sample SoC memory map listing for different memory region assignments, according to one or more disclosed implementations;

FIGS. 9A1 and 9A2 (collectively referred to as FIG. 9A below) illustrate an SoC topology representation that may be used to view topology of masters, slaves, switches, and bridges that connect them all together, according to one or more disclosed implementations;

DETAILED DESCRIPTION

Figure 1:
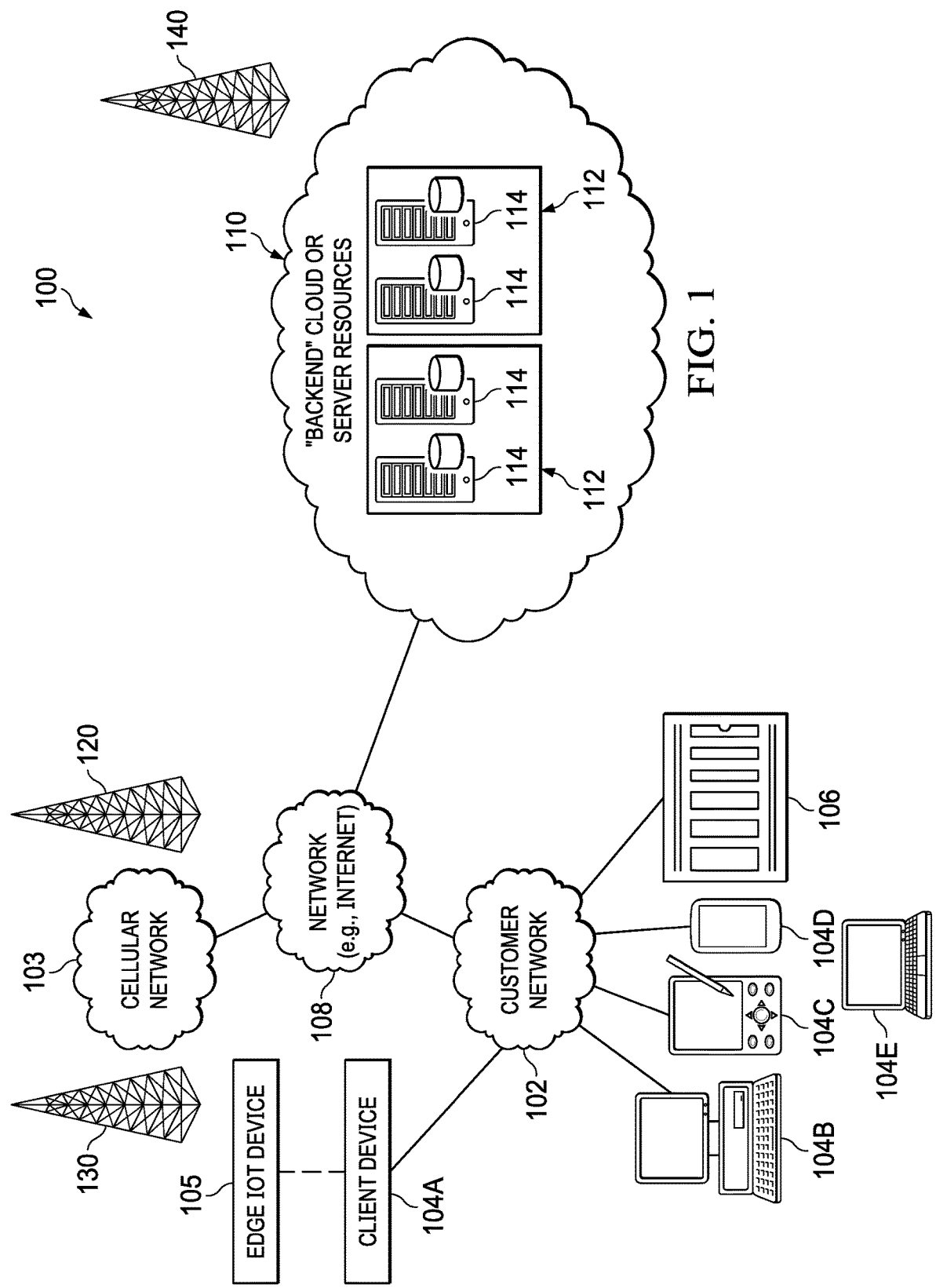
FIG. 1 illustrates a block diagram of an example of a networked computing infrastructure 100 where implementations of the present disclosure may operate.

In the following description, for purposes of explanation, numerous specific details are set forth in order to provide a thorough understanding of the examples disclosed herein. It will be apparent, however, to one skilled in the art that the disclosed example implementations may be practiced without these specific details. In other instances, structure and devices are shown in block diagram form in order to avoid obscuring the disclosed examples. Moreover, the language used in this disclosure has been principally selected for readability and instructional purposes, and may not have been selected to delineate or circumscribe the inventive subject matter, resorting to the claims being necessary to determine such inventive subject matter. Reference in the specification to "one example" or to "an example" means that a particular feature, structure, or characteristic described in connection with the examples is included in at least one implementation.

The term "computing system" is generally taken to refer to at least one electronic computing device that includes, but is not limited to, a single computer, virtual machine, virtual container, host, server, laptop, and/or mobile device or to a plurality of electronic computing devices working together to perform the function described as being performed on or by the computing system.

As used herein, the term "medium" refers to one or more non-transitory physical media that together store the contents described as being stored thereon. Examples may include non-volatile secondary storage, read-only memory (ROM), and/or random-access memory (RAM).

As used herein, the terms "application" and "function" refer to one or more computing modules, programs, processes, workloads, threads and/or a set of computing instructions executed by a computing system. Example implementations of applications and functions include software modules, software objects, software instances and/or other types of executable code. Note, the use of the term "application instance" when used in the context of cloud computing refers to an instance within the cloud infrastructure for executing applications (e.g., for a customer in that customer's isolated instance).

A typical SoC comprises multiple hardware components, including but not imited to:
- a microcontroller, microprocessor or digital signal processor (DSP) core—multiprocessor SoCs (MPSoC) having more than one processor core;
- memory blocks including a selection of ROM, RAM, EEPROM and flash memory;
- timing sources including oscillators and phase-docked loops;
- peripherals including counter-timers, real-time timers and power-on reset generators;
- external interfaces, including industry standards such as USB, FireWire, Ethernet, USART, SPI;
- analog interfaces including ADCs and DACs; and
- voltage regulators and power management circuits.

An SoC includes both the hardware, described above, and the software controlling the microcontroller, microprocessor or DSP cores, peripherals and interfaces. The design flow for a SoC (as implemented using VWB) aims to develop this hardware and software in parallel. Most SoCs are developed from pre-qualified hardware blocks for the hardware elements described above (e.g., referred to as modules or components which represent an IP core, or IP block), together with the software drivers that control their operation. The above listing of hardware elements is not exhaustive. Of particular importance are the protocol stacks that drive industry-standard interfaces like USB. In prior art systems, hardware blocks are put together using CAD tools; and the software modules are integrated using a completely separate software-development environment. Disclosed examples of VWB integrate these previously separate systems.

Once the overall architecture of the SoC has been defined, individual hardware elements may be described in an abstract language called RTL which stands for register-transfer level. RTL is used to define the circuit behavior. Hardware elements are connected together in the same RTL language to create the full SoC design. In digital circuit design, RTL is a design abstraction which models a synchronous digital circuit in terms of the flow of digital signals (data) between hardware registers, and the logical operations performed on those signals. RTL abstraction is used in hardware description languages (HDLs) like Verilog and VHDL to create high-level representations of a circuit, from which lower-level representations and ultimately actual wiring can be derived. Design at the RTL level is typical practice in modern digital design and supported by disclosed examples of the VWB.

Verilog is standardized as IEEE 1364 and is an HDL used to model electronic systems. Verilog is most commonly used in the design and verification of digital circuits at the RTL level of abstraction. Verilog may also be used in the verification of analog circuits and mixed-signal circuits, as well as in the design of genetic circuits.

Referring now to FIG. 1, networked computing infrastructure 100 is illustrated in block diagram format and represents an example of where implementations of the present disclosure may operate. Networked computing infrastructure 100 comprises a customer network 102, network 108, and a "backend" cloud or server resources platform/network 110. In one example, the customer network 102 may be a local private network, such as local area network (LAN) that includes a variety of network devices that include, but are not limited to switches, servers, and routers. Each of these networks can contain wired or wireless programmable devices and operate using any number of network protocols (e.g., TCP/IP) and connection technologies (e.g., WiFi® networks, Bluetooth®). Wi-Fi is a registered trademark of the Wi-Fi Alliance. Bluetooth is a registered trademark of Bluetooth Special Interest Group. In another example, customer network 102 represents an enterprise network that could include or be communicatively coupled to one or more local area networks (LANs), virtual networks, data centers, and/or other remote networks (e.g., 108, 112). As shown in FIG. 1, customer network 102 may be connected to one or more client devices 104A-E and allow the client devices to communicate with each other and/or with backend cloud or server resources platform/network 110. Client devices 104A-E may be computing systems such as desktop computer 104B, tablet computer 104C, mobile phone 104D, laptop computer 104E (shown as wireless), and/or other types of computing systems generically shown as client device 104A. Networked computing infrastructure 100 may also include other types of devices generally referred to as Internet of Things (IoT) (e.g., edge IOT device 105) that may be configured to send and receive information via a network to access cloud computing services or interact with a remote web browser application (e.g., to receive configuration information). FIG. 1 also illustrates that customer network 102 may be connected to a local compute resource 106 that may include a server, access point, router, or other device configured to provide for local computational resources and/or to facilitate communication amongst networks and devices. For example, local compute resource 106 may be one or more physical local hardware devices configured to communicate with wireless network devices and/or facilitate communication of data between customer network 102 and other networks such as network 108 and backend cloud or server resources platform/network 110. Local compute resource 106 may also facilitate communication between other external applications, data sources, and services, and customer network 102.

Networked computing infrastructure 100 also includes cellular network 103 for use with mobile communication devices. Mobile cellular networks support mobile phones and many other types of mobile devices such as laptops etc. Mobile devices in networked computing infrastructure 100 are illustrated as mobile phone 104D, laptop 104E, and tablet 104C. A mobile device such as mobile phone 104D may interact with one or more mobile provider networks as the mobile device moves, typically interacting with a plurality of mobile network towers 120, 130, and 140 for connecting to the cellular network 103. Although referred to as a cellular network in FIG. 1, a mobile device may interact with towers of more than one provider network, as well as with multiple non-cellular devices, such as wireless access points and routers (e.g., local compute resource 106). In addition, the mobile devices may interact with other mobile devices or with non-mobile devices such as desktop computer 104B and various types of client devices 104A for desired services. Although not specifically illustrated in FIG. 1, customer network 102 may also include a dedicated network device (e.g., gateway or router) or a combination of network devices that implement a customer firewall or intrusion protection system.

FIG. 1 illustrates that customer network 102 is coupled to a network 108. Network 108 may include one or more computing networks available today, such as other LANs, wide area networks (WANs), the Internet, and/or other remote networks, in order to transfer data between client devices 104A-E and backend cloud or server resources platform/network 110. Each of the computing networks within network 108 may contain wired and/or wireless programmable devices that operate in the electrical and/or optical domain. For example, network 108 may include wireless networks, such as cellular networks in addition to cellular network 103. Wireless networks may utilize a variety of protocols and communication techniques (e.g., Global System for Mobile Communications (GSM) based cellular network) wireless fidelity Wi-Fi networks, Bluetooth, Near Field Communication (NFC), and/or other suitable radio-based networks as would be appreciated by one of ordinary skill in the art upon viewing this disclosure. Network 108 may also employ any number of network communication protocols, such as Transmission Control Protocol (TCP) and Internet Protocol (IP). Although not explicitly shown in FIG. 1, network 108 may include a variety of network devices, such as servers, routers, network switches, and/or other network hardware devices configured to transport data over networks.

In FIG. 1, backend cloud or server resources platform/network 110 is illustrated as a remote network (e.g., a cloud network) that is able to communicate with client devices 104A-E via customer network 102 and network 108. The functions of backend cloud or server resources platform/network 110 could be performed by systems that are part of customer network 102 (i.e., dedicated customer server resources), however when implemented using a cloud infrastructure as shown, backend cloud or server resources platform/network 110 acts as a platform that provides additional computing resources to the client devices 104A-E and/or customer network 102. For example, by utilizing backend cloud or server resources platform/network 110, users of client devices 104A-E may be able to build and execute applications, such as automated processes for various enterprise, IT, and/or other organization-related functions. In one example, backend cloud or server resources platform/network 110 includes one or more data centers 112, where each data center 112 could correspond to a different geographic location. Within a particular data center 112 a cloud service provider may include a plurality of server instances 114. Each server instance 114 may be implemented on a physical computing system, such as a single electronic computing device (e.g., a single physical hardware server) or could be in the form a multi-computing device (e.g., multiple physical hardware servers). Examples of server instances 114 include, but are not limited to, a web server instance (e.g., a unitary Apache installation), an application server instance (e.g., unitary Java Virtual Machine), and/or a database server instance (e.g., a unitary MySQL catalog).

To utilize computing resources within backend cloud or server resources platform/network 110, network operators may choose to configure data centers 112 using a variety of computing infrastructures. In one example, one or more of data centers 112 are configured using a multi-tenant cloud architecture such that a single server instance 114, which can also be referred to as an application instance, handles requests and serves more than one customer. In some cases, data centers with multi-tenant cloud architecture commingle and store data from multiple customers, where multiple customer instances are assigned to a single server instance 114. In a multi-tenant cloud architecture, the single server instance 114 distinguishes between and segregates data and other information of the various customers. For example, a multi-tenant cloud architecture could assign a particular identifier for each customer in order to identify and segregate the data from each customer. In a multitenancy environment, multiple customers share the same application, running on the same operating system, on the same hardware, with the same data-storage mechanism. The distinction between the customers is achieved during application design, thus customers do not share or see each other's data. This is different than virtualization where components are transformed, enabling each customer application to appear to run on a separate virtual machine. Generally, implementing a multi-tenant cloud architecture may have a production limitation, such as the failure of a single server instance 114 causing outages for all customers allocated to the single server instance 114.

In another example, one or more of the data centers 112 are configured using a multi-instance cloud architecture to provide every customer its own unique customer instance. For example, a multi-instance cloud architecture could provide each customer instance with its own dedicated application server and dedicated database server. In other examples, the multi-instance cloud architecture could deploy a single server instance 114 and/or other combinations of server instances 114, such as one or more dedicated web server instances, one or more dedicated application server instances, and one or more database server instances, for each customer instance. In a multi-instance cloud architecture, multiple customer instances could be installed on a single physical hardware server where each customer instance is allocated certain portions of the physical server resources, such as computing memory, storage, and processing power. By doing so, each customer instance has its own unique software stack that provides the benefit of data isolation, relatively less downtime for customers to access backend cloud or server resources platform/network 110, and customer-driven upgrade schedules.

Figures 2, 10:
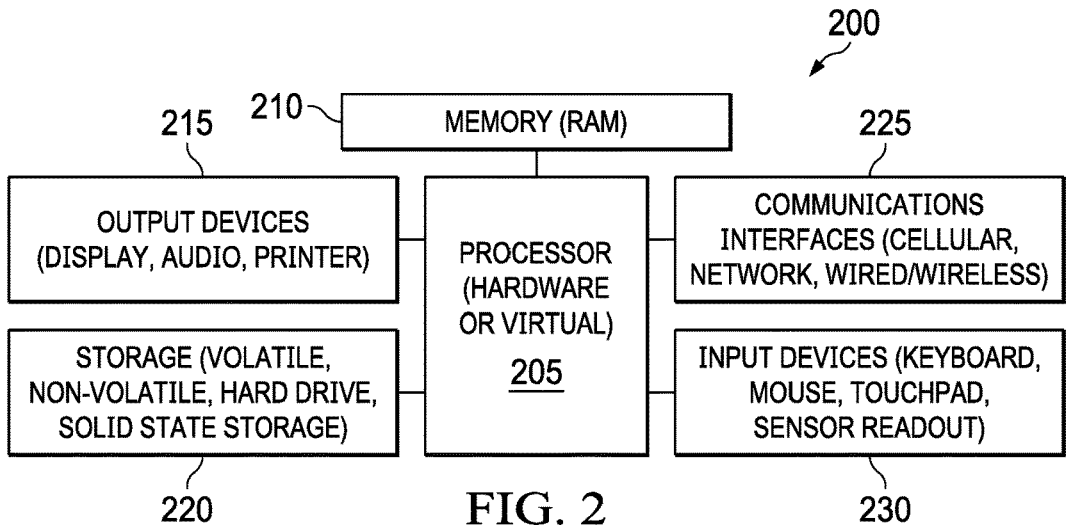
FIG. 2 illustrates high-level block diagram 200 of a computing device (computing system)
FIG. 10 illustrates in table 1000 a sample SoC interrupt matrix, according to one or more disclosed implementations.

FIG. 2 illustrates a high-level block diagram of a computing device 200 (computing system) that may be used to implement one or more disclosed examples (e.g., a service provider cloud infrastructure such as backend cloud or backend server resources 110, client devices 104A-104E, server instances 114, data centers 112, etc.). For example, computing device 200, illustrated in FIG. 2, could represent a client device or a physical server device and could include either hardware or virtual processor(s) depending on the level of abstraction of the computing device. In some instances (without abstraction) computing device 200 and its elements as shown in FIG. 2 each relate to physical hardware and in some instances one, more, or all of the elements could be implemented using emulators or virtual machines as levels of abstraction. In any case, no matter how many levels of abstraction away from the physical hardware, computing device 200 at its lowest level may be implemented on physical hardware. As also shown in FIG. 2, computing device 200 may include one or more input devices 230, such as a keyboard, mouse, touchpad, or sensor readout (e.g., biometric scanner) and one or more output devices 215, such as displays, speakers for audio, or printers. Some devices may be configured as input/output devices also (e.g., a network interface or touchscreen display). Computing device 200 may also include communications interfaces 225, such as a network communication unit that could include a wired communication component and/or a wireless communications component, which may be communicatively coupled to processor 205. The network communication unit may utilize any of a variety of proprietary or standardized network protocols, such as Ethernet, TCP/IP, to name a few of many protocols, to effect communications between devices. Network communication units may also comprise one or more transceivers that utilize the Ethernet, power line communication (PLC), Wi-Fi, cellular, and/or other communication methods.

As illustrated in FIG. 2, computing device 200 includes a processing element, such as processor 205, that contains one or more hardware processors, where each hardware processor may have a single or multiple processor cores. In one example, the processor 205 may include at least one shared cache that stores data (e.g., computing instructions) that are utilized by one or more other components of processor 205. For example, the shared cache may be a locally cached data stored in a memory for faster access by components of the processing elements that make up processor 205. In some cases, the shared cache may include one or more mid-level caches, such as level 2 (L2), level 3 (L3), level 4 (L4), or other levels of cache, a last level cache (LLC), or combinations thereof. Examples of processors include, but are not limited to a central processing unit (CPU) microprocessor. Although not illustrated in FIG. 2, the processing elements that make up processor 205 may also include one or more other types of hardware processing components, such as graphics processing units (GPUs), application specific integrated circuits (ASICs), field-programmable gate arrays (FPGAs), and/or digital signal processors (DSPs).

FIG. 2 illustrates that memory 210 may be operatively and communicatively coupled to processor 205. Memory 210 may be a non-transitory medium configured to store various types of data. For example, memory 210 may include one or more storage devices 220 that comprise a non-volatile storage device and/or volatile memory. Volatile memory, such as random access memory (RAM), can be any suitable non-permanent storage device. The non-volatile storage devices 220 can include one or more disk drives, optical drives, solid-state drives (SSDs), tap drives, flash memory, read-only memory (ROM), and/or any other type memory designed to maintain data for a duration time after a power loss or shut down operation. In certain instances, the non-volatile storage devices 220 may be used to store overflow data if allocated RAM is not large enough to hold all working data. The non-volatile storage devices 220 may also be used to store programs that are loaded into the RAM when such programs are selected for execution.

Persons of ordinary skill in the art are aware that software programs may be developed, encoded, and compiled in a variety of computing languages for a variety of software platforms and/or operating systems and subsequently loaded and executed by processor 205. In one instance, the compiling process of the software program may transform program code written in a programming language to another computer language such that the processor 205 is able to execute the programming code. For example, the compiling process of the software program may generate an executable program that provides encoded instructions (e.g., machine code instructions) for processor 205 to accomplish specific, non-generic, particular computing functions.

After the compiling process, the encoded instructions may then be loaded as computer executable instructions or process steps to processor 205 from storage 220, from memory 210, and/or embedded within processor 205 (e.g., via a cache or on-board ROM). Processor 205 may be configured to execute the stored instructions or process steps in order to perform instructions or process steps to transform the computing device into a non-generic, particular, specially programmed machine or apparatus. Stored data, e.g., data stored by a storage device 220, may be accessed by processor 205 during the execution of computer executable instructions or process steps to instruct one or more components within the computing device 200.

A user interface (e.g., output devices 215 and input devices 230) can include a display, positional input device (such as a mouse, touchpad, touchscreen, or the like), keyboard, or other forms of user input and output devices. The user interface components may be communicatively coupled to processor 205. When the output device is or includes a display, the display can be implemented in various ways, including by a liquid crystal display (LCD) or a cathode-ray tube (CRT) or light emitting diode (LED) display, such as an OLED display. Persons of ordinary skill in the art are aware that the computing device 200 may comprise other components well known in the art, such as sensors, powers sources, and/or analog-to-digital converters, not explicitly shown in FIG. 2.

As referenced in the Background section above, traditional design flow starts with system engineers reading module specifications and manually creating an SoC system specification to provide information on how each module is integrated. It is normally delivered in various text formats with perhaps some schematic drawings. Then a design engineer translates the text into a machine-readable form with aid from Electronic Design Automation (EDA) tools. Typically, the design stays in the EDA domain for synthesis and production. But this machine-readable domain can still exclude parts of the total project (e.g., software and documentation) thereby requiring more manual interpretation of those text specifications by other teams. The entire process is slow, inefficient, and error-prone and often results in mismatches amongst the specification, design, software, and documentation.

Development becomes more difficult when the SoC project and the modules it incorporates are being co-designed (e.g., collaborative development). As modules evolve, the SoC specification must also be evolved to match, and as the SoC architecture evolves, some modules may need to adjust. In some cases, there can be a full circular dependency loop that needs to be fully resolved for a given change. Even without circular dependencies, tracking module changes and ensuring consistency across the full project may be difficult and time-consuming.

To address consistency between specification and machine readable domains, a concept of an "executable specifications" may be used. The executable specification may include a single source for important data stored in a machine readable format that could be automatically propagated to the project consumers. Even though an executable specification concept would help with consistency, there is still a need to manage that specification information. In some cases, spreadsheets (with various revision control schemes applied) may be helpful but do not address reconciling changes (e.g., migration to new component version described below). Further, VWB improves communication of changes that affect other teams throughout the distributed collaborative development and testing environment (alerts and notifications are described below).

As disclosed herein, VWB provides a system and method to extract IP metadata directly from an IP release data base, and present the IP information directly for SoC specification purposes. VWB may be implemented as a web-based tool or implemented using a classical architecture for distributed or multi-user applications. VWB may be implemented, in whole or in part, on dedicated servers, distributed servers, cloud based infrastructure, as a web service, or in any other manner suitable to support the disclosed capabilities of a comprehensive and collaborative chip design system.

High-level features of VWB are listed here and discussed in more detail, as appropriate for this disclosure, below. Features provided by VWB may include, but not be limited to, auto discovery and extraction of IP meta data, chip project creation, memory map assignment, interface clock assignment, interconnect hierarchy construct, debug probe placement, firewall configuration, quality of service (QoS) configuration, interrupt connectivity netlist, event router creation, control module creation, clock tree, reset connectivity, power management connectivity, pinmux and I/O, and DFT connectivity and features. VWB automatically combines the SoC design constraints provided by the system engineer and IP metadata information to form a SoC specification in metadata format, which can be parsed and processed by systems configured to implement functions described herein. Because disclosed examples of VWB treat the system specification metadata as a single coherent data source for SoC, it is used to automatically create SoC-specific configurable IP (such as interconnect), top level netlist for SoC assembly, and a comprehensive IP integration specification. This eliminates any misinterpretation by the designer, because the IP specifies exactly how each interface is connected. All downstream SoC collateral is automatically generated from the same metadata source, which guarantees the data is consistent with the actual design. VWB has the capability to automatically discover new IP release and ability to compare and migrate among different versions of IP (e.g., different instances of components defined by IP metadata identified by different revision identifiers). VWB provides architecture aware capability and provides a frame work to easily extend to support new architecture capability. VWB allows multiple users to work collaboratively on the same project in a cohesive manner. VWB has the capability to generate SoC specific configurable IP, such as bus interconnect, interrupt interconnect, SoC top level control, etc. VWB also provides a generic frame work, which work with various metadata schemas. VWB provides the capability to create and edit live diagram based on the SoC specification. VWB automates the downstream software and customer documentation collaterals which consistent with the design. VWB increases the SoC design efficiency by removing multiple manual steps. VWB has the capability to automatically discover all the released IPs from a data base and present those IP metadata automatically (e.g., migration). VWB not only reduces errors from removing manual entering IP information, it also frees up system engineers working on system constrains instead of manually extracting IP metadata. VWB improves the quality of the SoC design through eliminating error from misinterpreting the design specification through delivering top level netlist, which specify how each interface is exactly connected and integrated. VWB reduces the verification cycles by embedding multiple levels of QC steps up front, so many issues can be found in the specification step. VWB also provides a single coherent SoC specification source that addresses SoC design and verification along with other downstream SoC specific deliveries such as software, tools and documentations.

Figure 3:
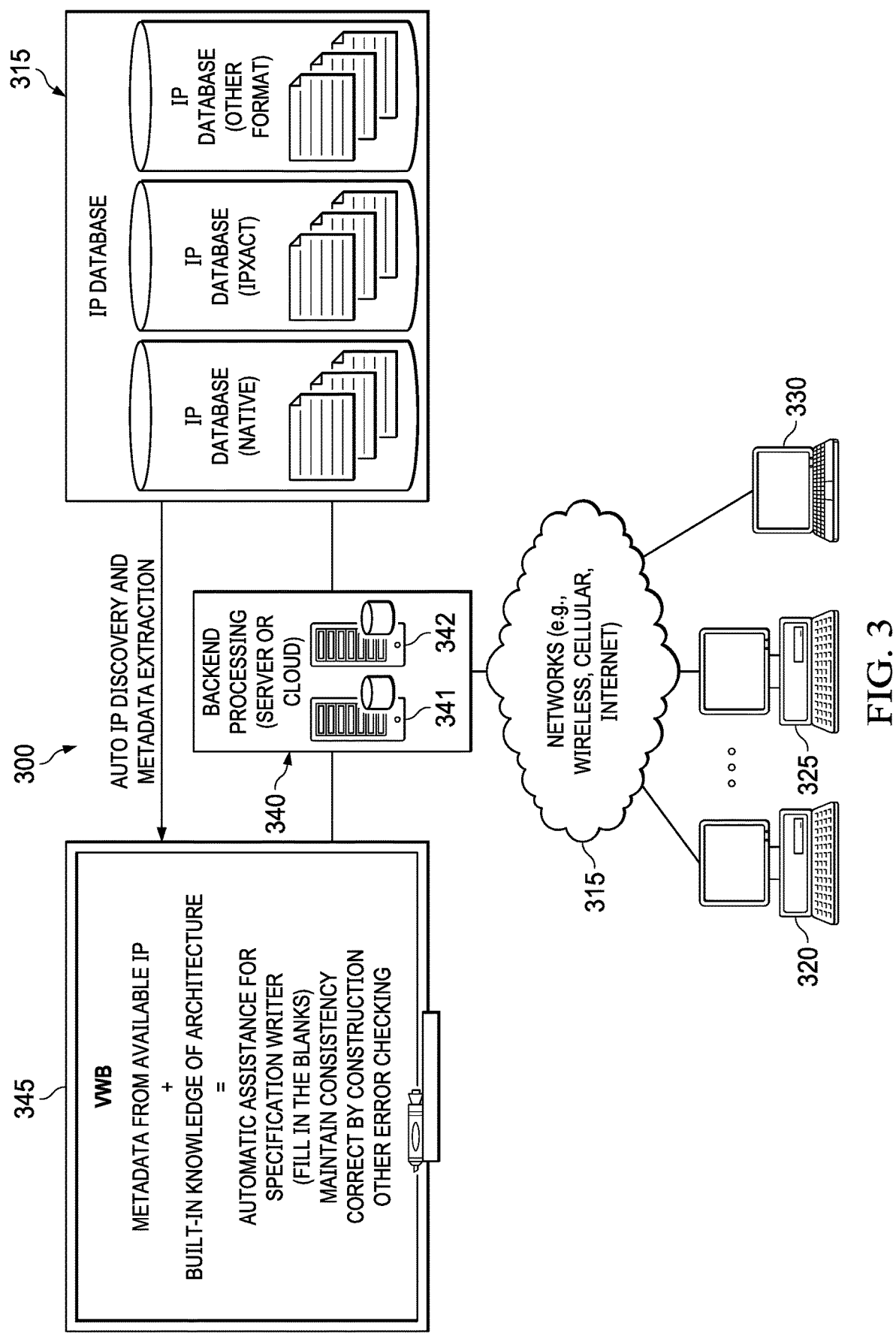
FIG. 3 illustrates block diagram 300 of multiple developer's endpoints connected through a network to a backend processing system configured to support a collaborative design environment, according to one or more disclosed implementations.

Referring now to FIG. 3, block diagram 300 of multiple developer's endpoints (320, 325-330) connected through a network 315 to a backend processing system 340 configured to support a collaborative design environment, according to one or more disclosed implementations. Backend processing system 340 may include a one or more servers (e.g., 341, 342) that may be implemented as physical servers or virtual machines on either local or cloud resources. Backend processing system 340 may include one or more databases 315 configured to store IP data in one or more formats. For example, data may be stored in a native format (e.g., proprietary format) designed for a specific implementation of VWB, in an specification standardized format such as IP-XACT, extensible markup language XML, or other database format. VWB 345 represents processing capabilities made possible through specific configuration of backend processing system 340 such that it may utilize metadata from available IP and built-in knowledge of chip architecture to provide automatic assistance for a specification writer to provide necessary information in an iterative manner and maintain consistency across all aspects of an SoC chip design. For example, VWB may perform automatic IP discovery and metadata extraction from the one or more databases 315 to present graphical representations of chip design (e.g., topology, interrupts, memory mappings, interconnects) to multiple end-users in a consistent and controlled manner such that each development team may focus on particular aspects of their portion of the overall chip. When ready, VWB allows each team to migrate their view of the overall architecture to include changes from other teams and ensure consistency for the entire project.

The collaboration model represents an important consideration for designing some implementations of VWB 345. As explained above, complicated SoC specifications rely on a team approach where several people may be working on different parts of the specification simultaneously. Implementations of VWB 345 should be able to support maintaining a coherent view of the project, even when edits of a first group of users affect other parts of the specification that are actively being edited by a second group of users. To achieve this, one implementation of VWB 345 was built on the Meteor web frameworks that handle managing, storing, and reconciling the data across the server and multiple connected clients. In this example implementation, Meteor interfaces to the React UI library, which provides a dynamic, data driven, and interactive UI for web pages. This allows a high degree of interaction with the UI despite the limitations of working within a web application.

Thus, in this example implementation, the server maintains the data and team members need only a web browser and a network connection to work on the SoC specification. The server-side framework (e.g., implemented on backend processing 340) handles any cross-user impacts by automatically pushing updated data to the connected users, keeping the user's views in sync with the server's data and each other. This capability ensures all parts of the specification are in sync with each other at all times.

In this example implementation, the user interface has support for both graphics and text. Both elements can be used for the SoC specification. Tables are an appropriate means of data entry for many parameters. Graphic representations of topologies with drag-and-drop connectivity support make visualizing and editing the design easier. Data can be stored in the server one way, then presented in different ways in different places, as appropriate for any particular design team. As illustrated in this example implementation, centralized management of specification IP data enables a true single-source approach to SoC design and enables the concept of an "executable specification" as mentioned above.

Figure 4:
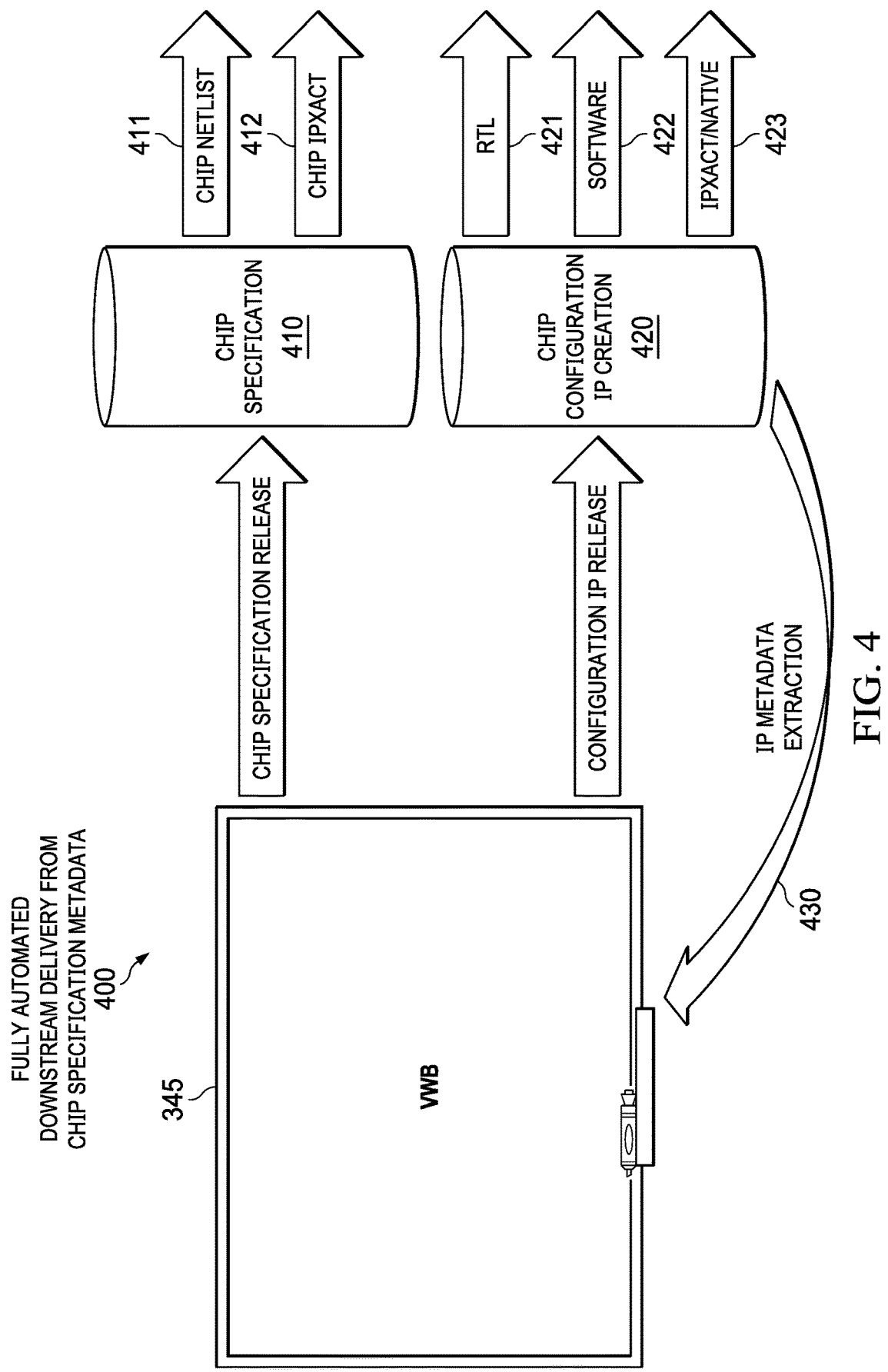
FIG. 4 illustrates diagram 400 depicting details regarding generation and maintenance of artifacts and collaterals related to chip design, according to one or more disclosed implementations.

Referring now to FIG. 4, diagram 400 illustrates details regarding generation and maintenance of artifacts related to chip design, according to one or more disclosed implementations. VWB 345 may be configured to provide chip specification 410 release data in one or more "export" formats including Netlist 411 or IP-XACT 412. VWB 345 may also be configured to provide chip configuration data required for IP creation 420 in multiple formats including RTL 421, Software 422, and IP-XACT/native 423. As shown at arrow 430, a feedback loop of IP metadata extraction may be provided back to VWB 345 for testing purposes and validation that output data representing IP creation does not introduce anything unexpected that may require attention from the chip designers. As briefly mentioned above, data output in RTL is at a very low level of abstraction and may expose more details than are apparent to engineers working with the specification information. By using outputs for chip creation data and comparing that output to specification data initially entered into VWB 345, it may be possible to automatically identify errors or areas of concern and present alerts or other notification to appropriate design team members. This may lead to correction of problems that, under prior art systems, might not be found until after a chip was physically built. Obviously, correcting problems prior to manufacturing represents a major cost and time saving improvement over prior art methods.

Figure 5:
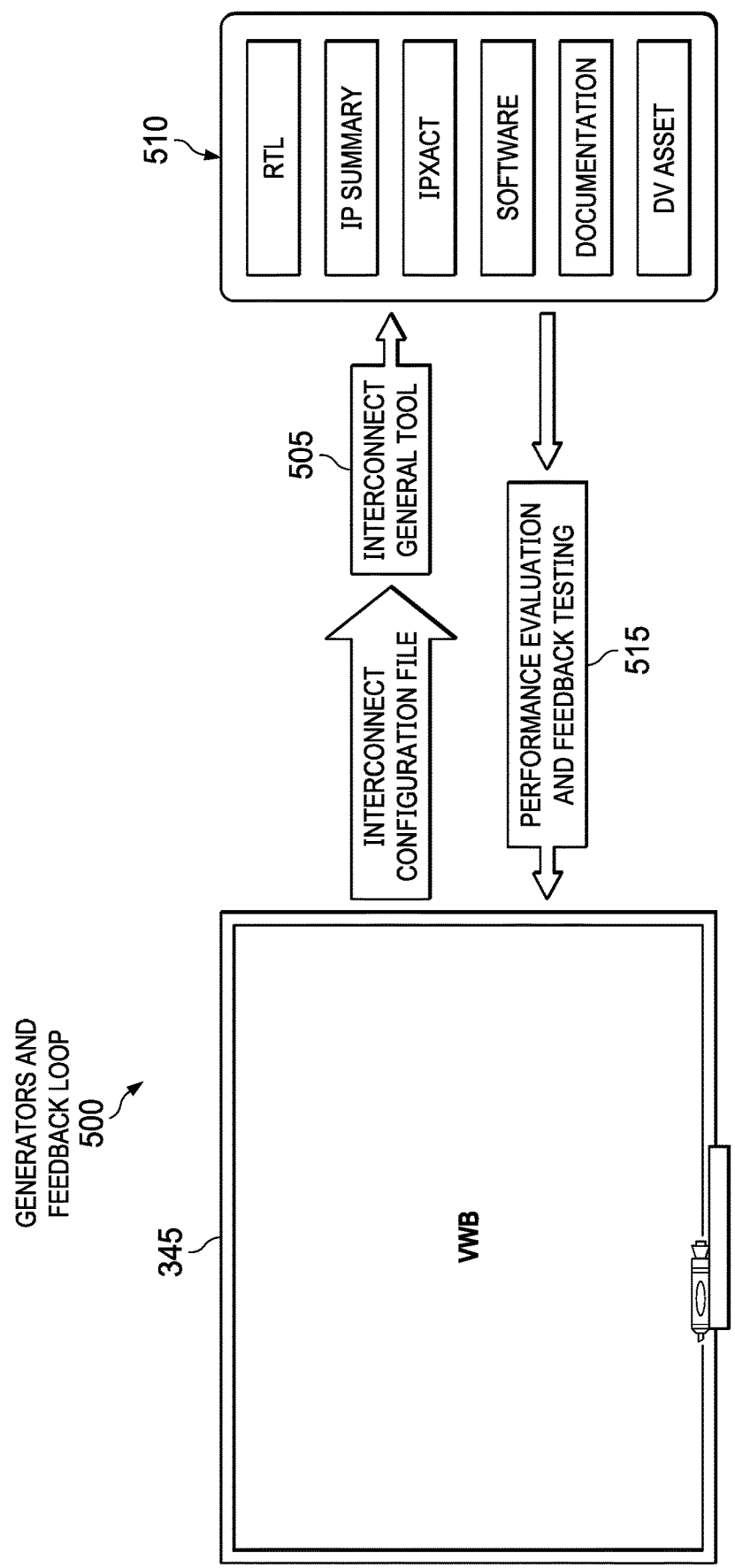
FIG. 5 illustrates block diagram 500 representing different collateral materials and information that may be managed, according to one or more disclosed implementations.

Referring now to FIG. 5, block diagram 500 represents different collateral materials and information that may be managed by VWB 345, according to one or more disclosed implementations. As shown in block diagram 500 interconnect configuration information may be exported from VWB and provided to an interconnect generator tool 505 to produce a variety of outputs 510 that are consistent with each other because they have all been maintained within VWB. Outputs 510 may include an RTL definition of the SoC, an IP summary, an IP-XACT representation of the SoC, Software drivers associated with a specific version of the SoC, documentation and design verification (DV) asset information. DV asset information may include anything that assists the DV team in doing their verification work. This can be a presentation of spec data in a format/way that is helpful to the DV team, log files or supplementary data from tools run during the process that assist the DV team, etc. As shown at block 515, a feedback of some of the generated information may be "imported" back into VWB to be used as additional information for design engineers. As stated above, the RTL generated may include additional information that when processed in the disclosed "loop back" fashion and compared against the specification input data, may identify areas of interest for design engineers to further consider.

Figure 6:
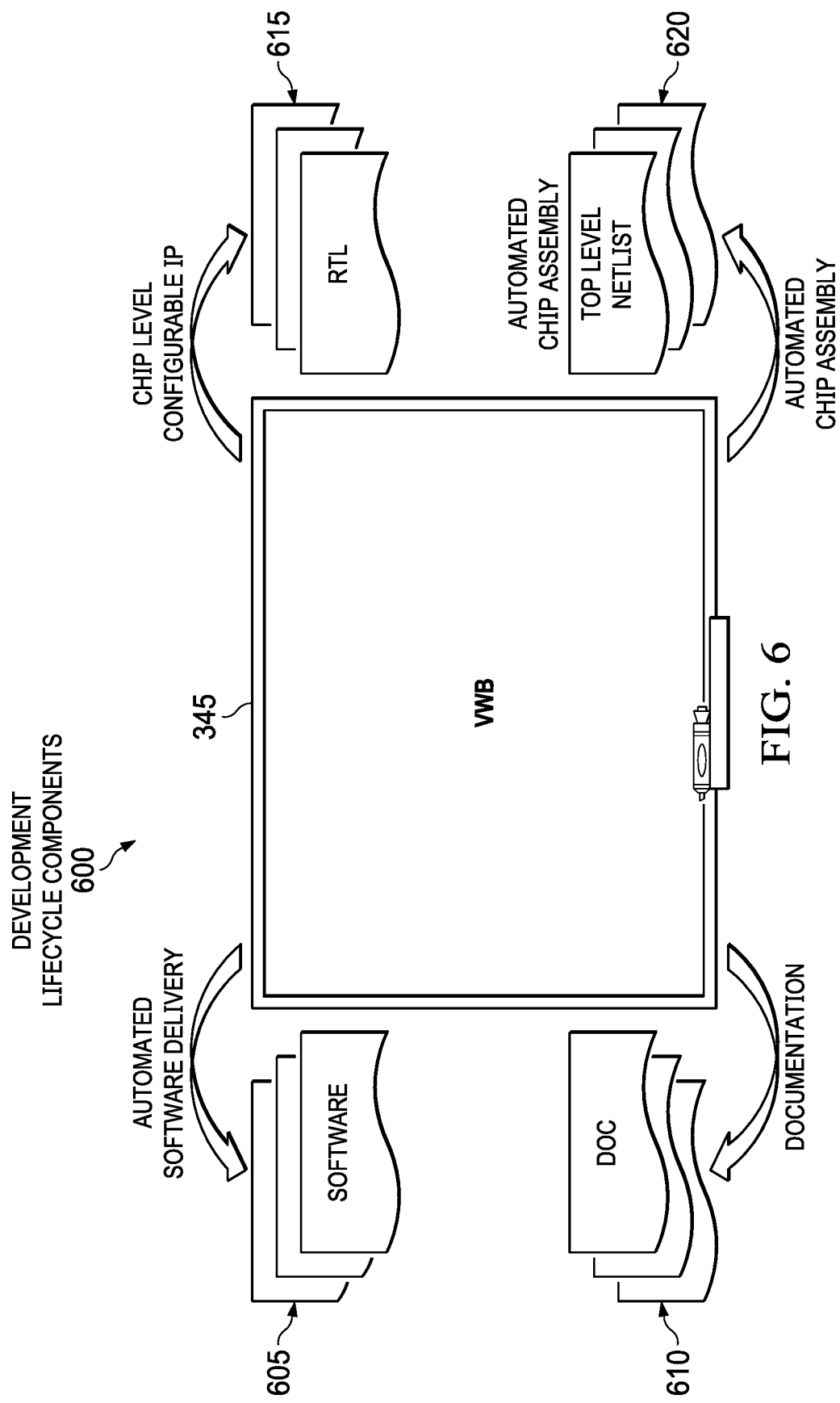
FIG. 6 illustrates block diagram 600 representing different collateral materials and information that may be managed in a collaborative distributed development environment, according to one or more disclosed implementations.

Turning to FIG. 6, block diagram 600 illustrates a relationship between different collateral materials and information that may be managed in a collaborative distributed development environment (e.g., VWB 345), according to one or more disclosed implementations. As illustrated, VWB 345 is central to maintaining information for automated and coordinated software delivery (software 605). VWB 345 maintains documentation 610 and chip level configuration IP (e.g., RTL 615). Finally, VWB 345 provides automated chip assembly information including top level Netlist information 620.

Referring now to FIG. 7, table 700 illustrates a sample SoC IP contents list (e.g., bill of materials "BOM") as it may be presented to a developer while using VWB, according to one or more disclosed implementations. The list of modules by module name is shown in column 705; instance identification for components of that module is shown in column 710; revision number of the instance is shown in column 715; and an indication if this module is included in the "project A" chip is shown in column 720. As explained above, modules are groups of reusable logic and code that may be present in an SoC. An instance represents an instance of a component within a given module. For example, module adc_12_gs80 has an instance named "mcu_0" and an instance named "mcu_1" to represent two instances of an adc in that module. Note, "mcu" stands for microcontrol unit and "adc" stands for analog to digital converter as used here. The "mcu_" part of the instance name denotes that this instance belongs to the "mcu" domain of the SoC. In this context, the SoC has several "domains" where related modules are grouped together so they can be powered & clocked independently of the other domains. There are other considerations with respect to power and clock control, but VWB maintains a segmenting of the SoC into logical domains so that engineers can work with respect to those domains. For example, a BOM may list the following information:

TABLE 1

| Module | Instance | Version | Included Flag (project name) |
|---|---|---|---|
| mshsi2c | main_0 | 1.0.0.6 | Y |
| mshsi2c | main_1 | 1.0.0.6 | Y |
| mshsi2c | main_2 | 1.0.0.6 | Y |
| mshsi2c | main_3 | 1.0.0.6 | Y |
| mshsi2c | main_4 | 1.0.0.6 | Y |
| mshsi2c | main_5 | 1.0.0.6 | Y |
| mshsi2c | main_6 | 1.0.0.6 | Y |
| mshsi2c | mcu_0 | 1.0.0.6 | Y |
| mshsi2c | mcu_1 | 1.0.0.6 | Y |
| mshsi2c | wkup_0 | 1.0.0.6 | Y |

In the Example of table 1 above, we have 10 identical i2c instances, but 7 of them are grouped in the "main" domain, 2 in the "mcu" domain, and 1 in the "wakeup" domain.

Throughout the SoC design, each module instance is identified by module name and a user-selected instance name; module instances are always bound to a specific revision. There may be different revision numbers for the "same" module throughout the lifecycle of the chip design/test process. The BOM keeps track of which instances and revisions of particular modules/components are present in a particular SoC design project from the perspective of individual design teams. That is, different team members may work with stable components supplied by other teams while focusing on getting their own portion to match design criteria. Then, when appropriate for each design team, they may adjust their BOM to point at newer (or different) modules, instances, and revisions as appropriate to make their development efforts "current" with other teams. Sometimes, older and newer revisions of a component may be present in the same final SoC design because of performance and cost considerations. For example, if a cheaper component meets design criteria for some portions of an SoC while a more expensive version of that same component is required for other portions of the same SoC. After an adjustment to a BOM, a migration process (discussed below) may be automatically initiated in some implementations of VWB 345.

Module revision migration is a capability mentioned above. In an example implementation, the user can call up the migration tool in the UI, which will present the user with a visual view of two different versions of IP. Any resources that have the same type and name in the old and new are deemed equivalent by default. Differences may be presented and emphasized in various ways. For example, there may be a highlighted portion of a dialog box to identify changes or portions of the information may be suppressed from the dialog box (i.e., not shown) to bring emphasis to those portions that are shown. The user may then edit the mapping of equivalent resources, either to make or break the connections between old and new resources. Once the user is satisfied with the mapping, VWB will preserve items that are equivalent, delete any old resources that do not exist in the new, and add any new resources that did not exist in the old. Thus, the SoC project is updated to be in sync with the new revision, while preserving maximal spec data from the old. Changes between revisions of modules that are migrated may include any of the module capabilities, including but not limited to, changed interrupts, new or different outputs, different power requirements, different bus speeds, etc.

Figure 9B:
FIG. 9B illustrates SoC topology data block 905 from FIG. 9A in more detail.

Referring now to FIGS. 8 and 9A-B, table 800 of FIG. 8 illustrates a sample SoC memory map listing for different memory region assignments, according to one or more disclosed implementations. FIG. 9A illustrates an SoC topology representation that may be used to view topology of masters, slaves, switches, and bridges that connect them all together, according to one or more disclosed implementations. FIG. 9B illustrates SoC topology data block 905 from FIG. 9A in more detail.

In FIG. 8, the address range of memory designated to a particular region is listed in column 805. A name for each region is listed in column 810. Column 815 identifies the size of each region. Once module instances have been added to the design (e.g., added to the BOM), VWB can automatically begin populating all the architecture planes. For system interconnect, there are, in this example, at least two views: 1) the memory map for address-mapped endpoints (see table 800), and 2) the topology of masters, slaves, switches, and bridges that connect them all together (see FIGS. 9A-B).

After a user enters all the module instances in the SoC project, VWB automatically gathers the list of memory-mapped regions from those components and pre-populates the memory tables with the required size. The user only needs to provide the base address for each memory region. The user can also choose to assign a larger or smaller memory region than the module requires, or create some alias address regions by providing the override values. VWB also automatically checks the allocated address space for overlapping areas and collisions, and highlights those regions to give the user a visual warning.

The memory map can be viewed in two modes: the whole-SoC flattened view, and view limited to the contents of just one particular section of the system interconnect. The former shows all of the memory-mapped resources on the whole device without regard to the connection topology; this is similar to the programmer's view of the device. The latter view is useful because the system interconnect can be made of several distinct sections stitched together. For assembly and SoC project management reasons, it is desirable that these sections be independent of each other once built. In order to support this, the user must determine the address ranges that will traverse the section boundary in advance—otherwise each section would be dependent on every other section to which it is connected. Using the single-topology-section view mode, the user can determine which address ranges will be routed to other sections. In this mode, VWB assists by looking up the contents of the connected sections, and highlighting any remote memory-mapped resources that are unreachable in the current configuration.

The system interconnect is normally the most complex piece of SoC assembly, with a multi-layer crossbar structure to allow the communications between master and slave ports. VWB sorts all the physical ports into master interface group and slave interface group. VWB provides a whiteboard-like sketching capability to allow user create the system interconnect schematic view. View 900 illustrates a zoomed out view of the interconnect. Each of boxes 905, 910, 911, 915, and 916 represent a crossbar (sometimes called a switched central resource ("SCR")) with endpoints connected. For simplicity and ease of reading blocks 905-916 will be referred to here as crossbars even though it is understood that they are shown in view 900 as dialog/text boxes with information corresponding to a particular crossbar and not an actual crossbar. Endpoints on a common crossbar can exchange data locally. The crossbars are linked to each other in a topology that can govern how endpoints on one crossbar can exchange data with endpoints on another. In view, 900, crossbar 905 has a one-way link to crossbar 910. Masters connected to crossbar 905 can access slave resources on crossbar 910, but masters on crossbar 910 cannot access slaves on crossbar 905 because there's no link in that direction. It is possible to have a two-way link where every master can see every slave across both crossbars, but that is not shown in the example of view 900. In view 900, crossbar 905 can access crossbar 910 (including its downstream links), crossbar 910 can access crossbar 911 and crossbar 915, crossbar 915 can access crossbar 916, and crossbars 911 & 916 are local only. Thus, endpoint masters on crossbar 905 can see all slaves in view 900 because there is a path that leads to any slave from crossbar 905, but endpoint masters on crossbar 910 see only a subset of slaves (specifically, all but slaves on crossbar 905).

Additionally, in block 905 shown larger in FIG. 9B, the letters IQDBV are shown to the left of each endpoint master and letters FDBV are shown to the right of each endpoint slave (and link slave). IQDBV and FBDV are master/slave optional attributes that can be turned on in the fabric generator. These include but are not limited to, bridges, security firewalls and debug probing points. Each letter stands for a feature that can be enabled or disabled on that port, and the VWB user can select which features they want on any given endpoint by selecting and making active its corresponding letter through the click of a button. Other types of optional attributes are also possible. A VWB user may be provided a capability to create crossbars on the fly, linking them into the desired topology and dropping the master and slave interfaces into the appropriate segments. Because certain implementations of VWB may be coded to understand architecture constructs, those implementations of VWB have the intelligence to present the critical configuration knobs in the web tool which are required for fine tuning the system interconnect, such as bridge FIFO size parameters, the number of firewall regions, etc. (See FIG. 9A). VWB automatically generates the system interconnect configuration file based on the schematic view, memory map assignment and all the other critical configurations.

After the interconnect information of the SoC is sufficiently configured, VWB can be commanded to invoke the generator (505 of FIG. 5) to build RTL and release it in the Content Management System (CMS) as handoff to downstream consumers (see FIGS. 4 and 5). Meanwhile, other spec work can continue while this "snap shot" of development is evaluated and tested.

Referring now to FIG. 10, table 1000 illustrates a sample SoC interrupt matrix, according to one or more disclosed implementations. A complex SoC can have thousands of interrupts and DMA events, which are connected either directly to each other or going through some interrupt/DMA aggregation and routing logic. VWB automatically gathers all the interrupt and DMA events from all of the IP instances. VWB provides a tabular interface such as table 1000 to allow a user to present interrupt information correlated by source groups and sink groups. As shown at block 1005, a VWB interface allows for filtering based on source/destination and keeps a running count of how many interrupts are unassigned (in this example 958 interrupts need assignment). VWB also allows the user to specify the connectivity between individual source events (e.g., 1030, 1035, and 1040) and an IP module instance with sink inputs (1015, 1020, and 1025). Column 1015 identifies sink inputs for module "esm_main," instance "main_0." Column 1020 identifies sink inputs for module "fss" instance "mcu_0" and column 1025 identifies sink inputs for module "gic500ss" instance "main 0." The intersection of row and column in table 1000 identifies which particular sink input for the Ip instance is used for the connection. In this example, the intersection of rows 1035 and 1025 identifies that the 1035 event is connected to input ppi0_0.29 of gic500ss.main_0 (instance "main_0" of module "gic500ss"). This presentation format has been found to be easy to read and useful to ensure all connections are defined. Block 1005 also shows push buttons labeled "+Dist" and "+Router" which can be used to create new interrupt aggregation blocks on the fly. Clicking the button will cause a new column for the added module along with new rows representing the sources and sinks of the added module. The "Unhide Cols" push button represents a display filter for the columns (a user can hide selected columns for easier viewing of a subset then unhide to go back to looking at everything). In this example, VWB highlights unconnected event sources, for example as shown in column 1010 for line 1030, as a warning to ensure no event or interrupt is overlooked.

In addition to direct connection of source events and sink events, an SoC may require special logic to handle event multiplexing, routing, and aggregation. VWB allows the user to define these blocks and insert them on-the-fly. The inputs and outputs of these blocks are then available for connections in the matrix. VWB provides the appropriate configuration knobs to control the adjustable parameters of these blocks. Just like the system interconnect information mentioned above, once the blocks have been configured, the generator can be invoked to generate RTL and release to the CMS.

Data Model

In one example implementation, the Meteor framework that handles data movement for VWB is tightly integrated to a MongoDB back end. Mongo is a schema-less database that organizes collections of documents in Javascript Object Notation (JSON) format. These are approximately analogous to tables and records in the traditional database world. In some implementations, the design ecosystem in which VWB is deployed is not JSON based, so there is an extraction process to pass module metadata to VWB. The extraction process can be implemented by opening a module revision in the design ecosystem, use that toolset to query the parameters and interfaces of the module under inspection and then write out a JSON file with a description of the module. This JSON file can then be directly imported into the "IP" collection in VWB, making it available to use in SoC projects.

In a typical implementation, SoC data is split up among many documents to make data management easier and more modular. To assist in coordination across sets of documents, each document may be referenced by set of uniquely identifying parameters such as:

1. A globally-unique ID;
2. A "doctype" to categorize the type of document;
3. Information identifying which part of the SoC it describes, in the form of native data types or links to other documents; and
4. Data properties describing the information represented, also in the form of native data types or links to other documents.

An example of a module instantiation record ("IpInstance" doctype) might have the following attributes:

```
{
"_id": "8YqtbzLeKz6zQMrQg",
"doctype": "IpInstance",
"SoC": "D67yapMySQmtunKoA",
"Ip": "uart_6.3.6.0",
"instance": "mcu_0",
"reserved": false,
}
```

The above example identifies that the document represents an instance of a uart module at version 6.3.6.0. This instance of a uart module is "mcu_0" and is part of the SoC project pointed to by the id "D67yapMySQmtunKoA". Finally, the instance is not reserved because the Boolean flag "reserved" is set to "false".

Other data about the SoC design may be identified similarly, and because any document may be referred to by its unique id, it is possible to build hierarchies of information spread across documents to represent hierarchy and connectivity in the design. For instance, the clocks implemented by this uart instance will each get represented as a "Clock" doctype, with a pointer back to the id "8YqtbzLeKz6zQMrQg" representing that clock is owned by the module instance. The clock documents can also store a pointer to another Clock document representing a logical connection. For example, the connected clock could be the output clock owned by a phase lock loop (PLL) module, representing the uart clock is sourced from the output of a particular PLL.

By tailoring the set of permissible doctypes and the data they contain, the MongoDB (or other database) representation of the SoC can be extremely tightly coupled to the architecture of the device. Structuring the data appropriately can also help guarantee correctness by construction as the data structures can be designed to help make storage of illegal or nonsensical data not possible. For example, if a particular clock input may only have a point-to-point connection with another clock, the data can be structured so that only a single pointer to another clock can be stored, eliminating the possibility of an illegal double-connection.

With the appropriate data structure in place, the UI development environment can render the data into views of the SoC and allow manipulation of the data with text entry, drag-and-drop, etc. See FIG. 15, discussed below, illustrating flowchart 1500 representing one possible implementation of data and control flow to present a drag and drop interface allowing developer manipulation of a memory map for example.

Use Model

Figure 11:
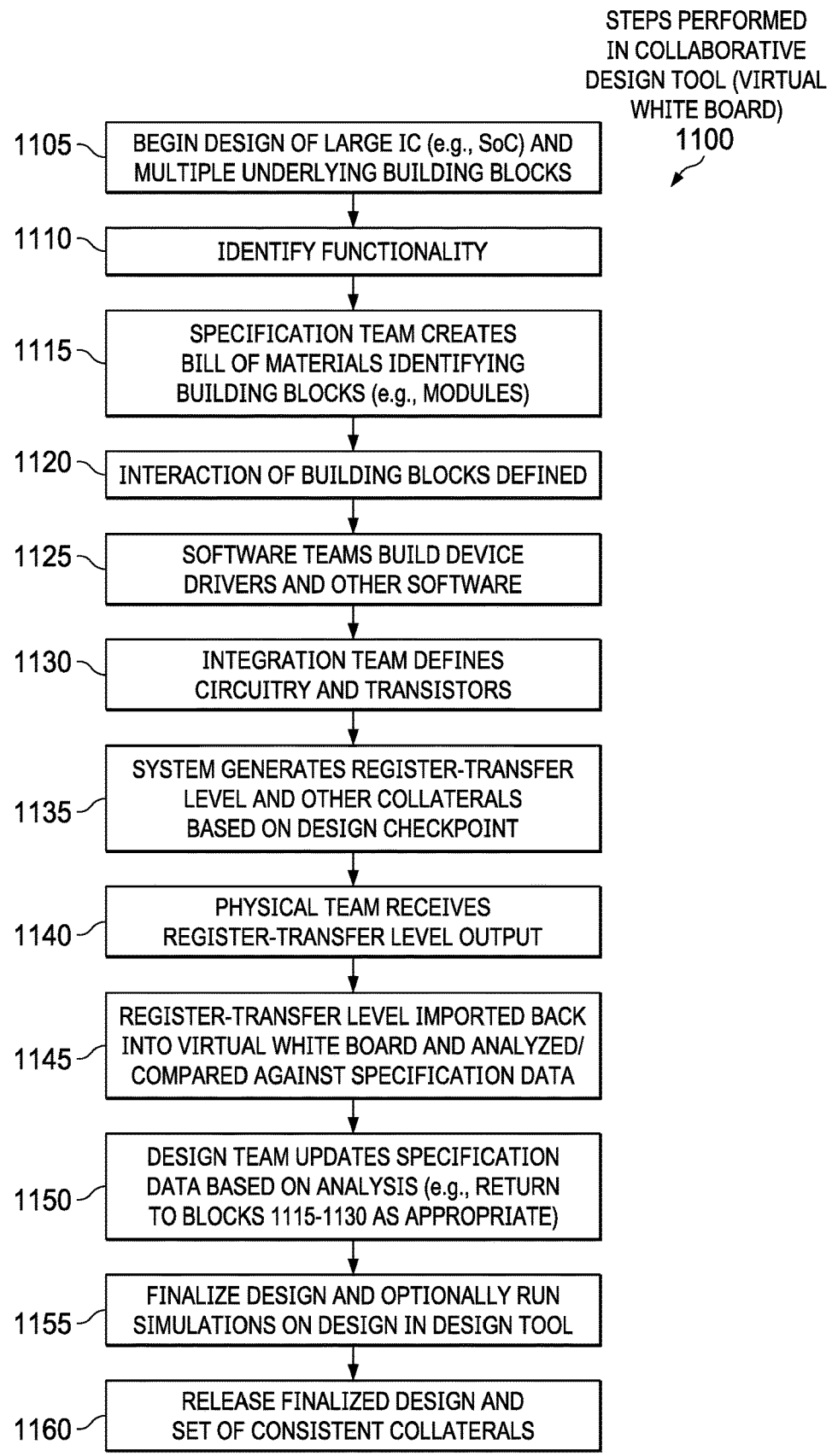
FIG. 11 illustrates operation 1100 representing one possible method for chip design with multiple user inputs and a database containing information to support revision updates, according to one or more disclosed implementations.

Referring now to FIG. 11, an example flowchart illustrates operation 1100 that may be performed in a collaborative design tool (e.g., VWB) to manage design criteria across multiple design teams, according to at least one example implementation. In a similar manner to traditional SoC design, VWB starts at block 1105 with an overall definition of requirements for an SoC. At block 1110, functionality requirements of the SoC are identified and entered as a starting point. Block 1115 identifies that, as part of this effort, a specification team creates a BOM (See FIG. 7 above) reflecting an inventory of components of a given SoC under development. Available modules/components are added to the BOM, given instance names, and interaction of the building blocks is defined (block 1120). At this point, as indicated by block 1125, software teams may build device drivers and other software artifacts (e.g., collaterals). VWB may track this development to keep it consistent in functionality with other aspects of the SoC under development. Block 1130 identifies that an integration team may define circuitry and transistors for the SoC. As part of this process, individual users may add, edit, remove, or migrate instantiated components. Migration is predominately used for updating to a newer revision of a module, but can be done from any module/revision to any other module/revision and may be done multiple times throughout an SoC development lifecycle. It is important to note that the flow of operation 1100 is not likely to be serial and many of the steps shown will overlap in time or be performed multiple times in an order required by criteria of a particular design effort. To reach a checkpoint in initial development, VWB assists by ensuring that interfaces implemented by the module instances are available to connect (e.g., highlighted so they are not left orphaned), with the option of specifying parameters for the connection as needed. These connections are defined on pages organized by architectural plane (e.g. memory maps, clock tree, data topology) where the data is organized in a manner that is appropriate for that aspect of the specification. Data may appear in more than one location on these pages or in multiple pages. As long as the data resolves to a single location in the database, multiple elements displaying the data will be kept in sync.

Interconnect fabrics such as the NoC are a large and important part of the SoC, and may be custom to each project. Unlike modules that are ideal black-box boundary descriptions, these interconnect fabrics need to be created based on their connectivity. Thus, there is much overlap across design teams in the work needed to integrate them and construct them. VWB handles this by capturing the connectivity for these fabrics, allowing the specification writer to assemble the internals into workable topologies and then build the infrastructure modules. VWB can also recognize modules added to the SoC bill of materials that were self-built and handle them appropriately—by de-duplicating interfaces that are already modeled, adding only interfaces not yet represented. This de-duplication technique allows for full integration of the built module just like any pre-built module, without requiring a modeling of every interface pre-build. Only the interfaces necessary to configure the infrastructure generator need to be modeled pre-build.

When a sufficient amount of definitional data has been entered, VWB can export data by making releases of some or all of the specification as shown at block 1135. This export can take the form of a building a module for SoC infrastructure, or reports (machine and human readable) for data export to consumers. At block 1140, a physical team may receive RTL output consistent with a checkpoint of the definitional data exported. Recall that RTL is a very low level definition of actual chip functions without requiring actual fabrication of an SoC. Block 1145 indicates that the RTL information may be imported in a "feedback loop" fashion to VWB and compared through analysis to the checkpointed definitional data. Block 1150 indicates that design teams may be presented with information identified by this analysis and may alter specification data as necessary. This process may iterate several times with updates to the Specification data in VWB and generation/analysis of exported output. After this process has been determined to produce a sufficiently correct output, flow continues to block 1155 where the design may be "finalized" and further simulations may be run in a design tool. Block 1160 indicates that once all simulations have been run successfully, the design may be released as a comprehensive set of consistent collaterals and fabrication of a prototype SoC may take place. Clearly, if errors are found in the prototype SoC, engineers may return to process 1100 at any point to make adjustments and complete the design lifecycle again.

Figure 12:
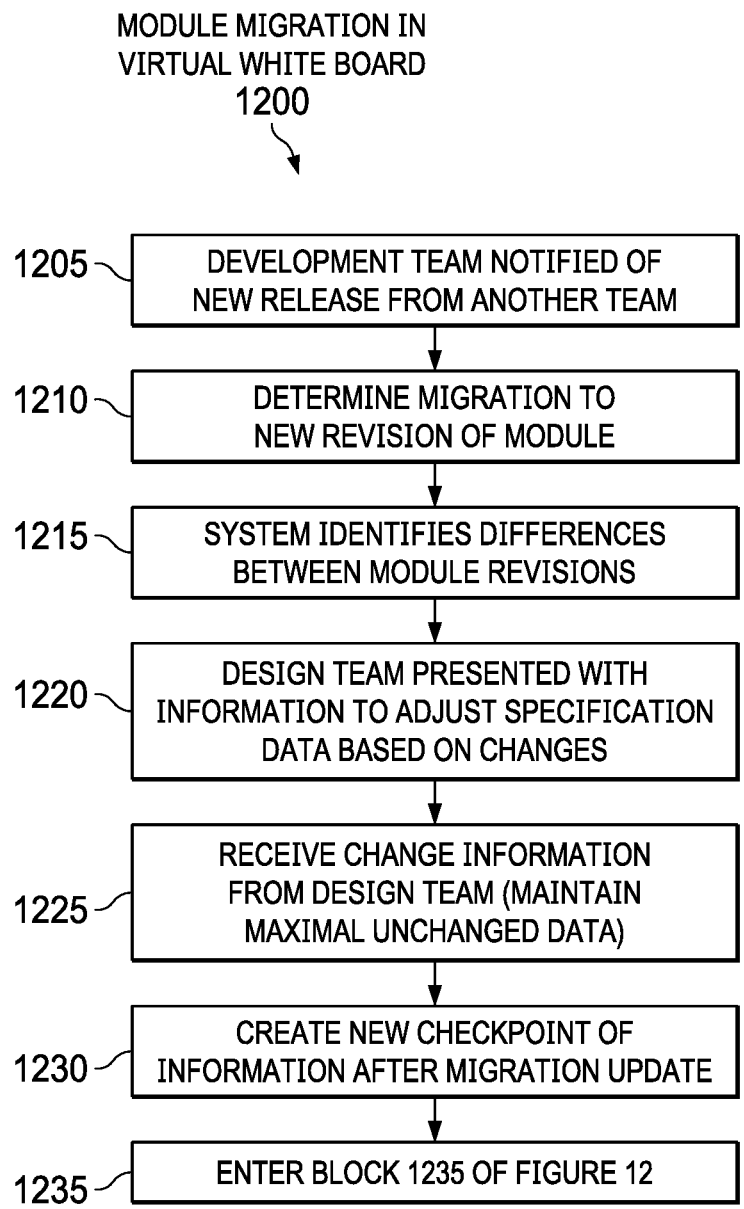
FIG. 12 illustrates process 1200 representing one possible method for migration from one version of a module to an updated version of that same module during the design lifecycle of an SoC, according to one or more disclosed implementations.

Referring now to FIG. 12, operation 1200 represents one possible method for migration from one version of a module to an updated version of that same module during the design lifecycle of an SoC, according to one or more disclosed implementations. As mentioned previously, modules represent building blocks of components of an overall SoC design. During the design lifecycle, changes to capabilities of a module and its inputs, outputs, interrupts, etc. may change. VWB attempts to assist incorporation of these types of changes for a design engineer, in part by providing visual guidance to address areas that need corresponding changes while de-emphasizing areas that may remain consistent. Beginning at block 1205, a development team is notified of a new release from another team. This notification may be proactive in the form of an alert presented by VWB to teams affected by a recognized change introduced by another team. Alternatively, the notification may be passive, in that VWB will present information about newly available module revisions in a selection dialog box such that they are noticed the next time a development team opens that selection dialog box. Once a development team indicates that they wish to incorporate an updated module (i.e., migrate to a newer version) as indicated at block 1210, flow continues to block 1215 where the system automatically identifies differences between module revisions. This migration process can be performed to migrate to a newer revision (which is the more prevalent case) or may migrate back to an older revision. Block 1220 indicates that the design team is presented with information to adjust specification data based on changes. This presentation may emphasize and de-emphasize portions of specification data as appropriate so that a migration may be performed efficiently. Block 1225 indicates that input regarding required changes may be received from the design team performing the migration and the system will maintain a maximal amount of unchanged data. Block 1230 indicates that data may be saved after migration has been completed and block 1235 indicates that flow may continue back to block 1135 of FIG. 11 where a new version of data may be exported for further testing. Of course, flow could return to any point in the design process as appropriate after a module migration is completed.

Figure 13:
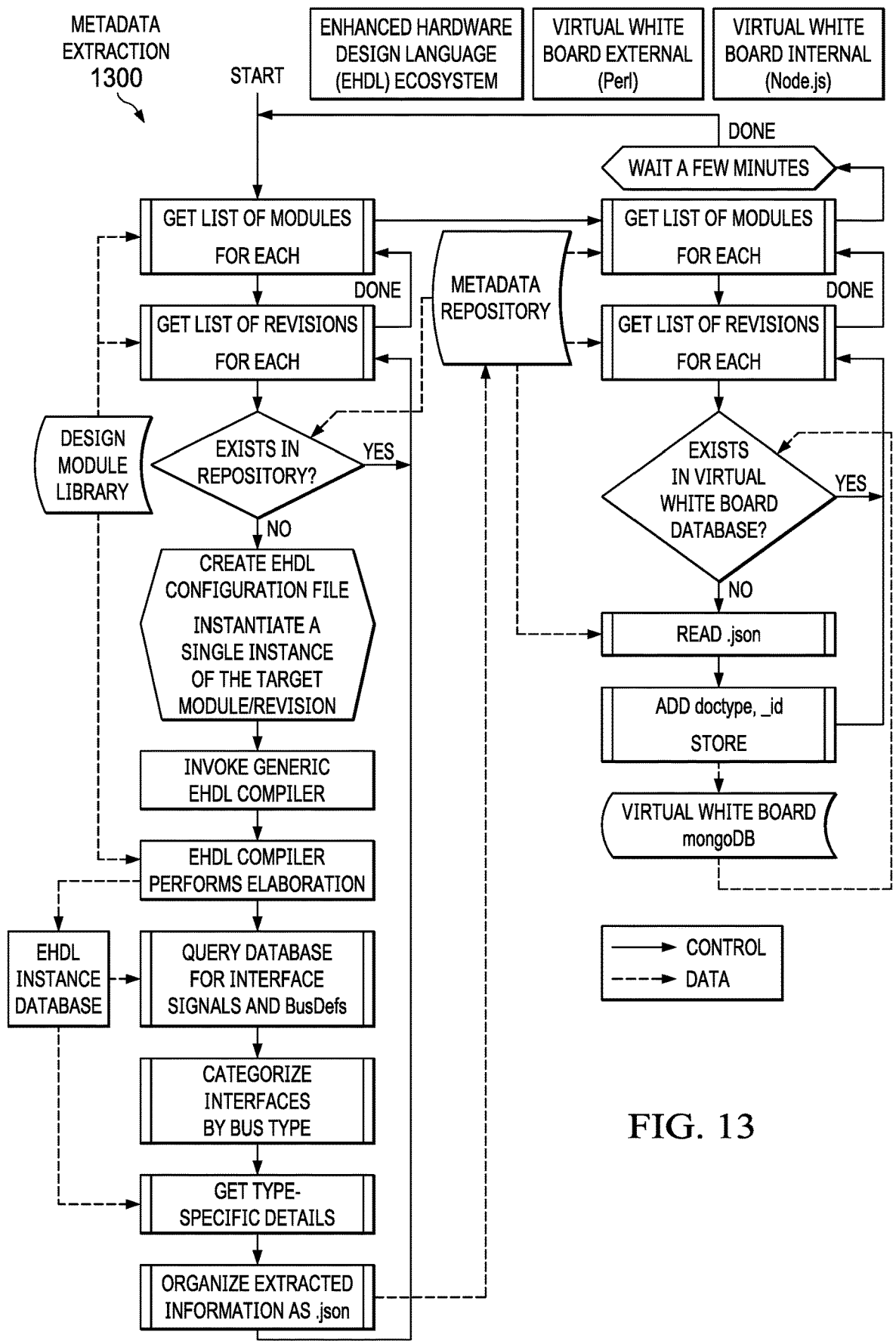
FIG. 13 illustrates flowchart 1300 representing one possible method for metadata extractions, according to one or more disclosed implementations.

Referring now to FIG. 13, flowchart 1300 representing one possible method for metadata extractions, according to one or more disclosed implementations. Metadata extractions may be useful for exporting information from the VWB design environment to prepare for testing and other validation activities as discussed above. Metadata extractions may also be used as part of the migration process discussed above for operation 1200.

Figure 14:
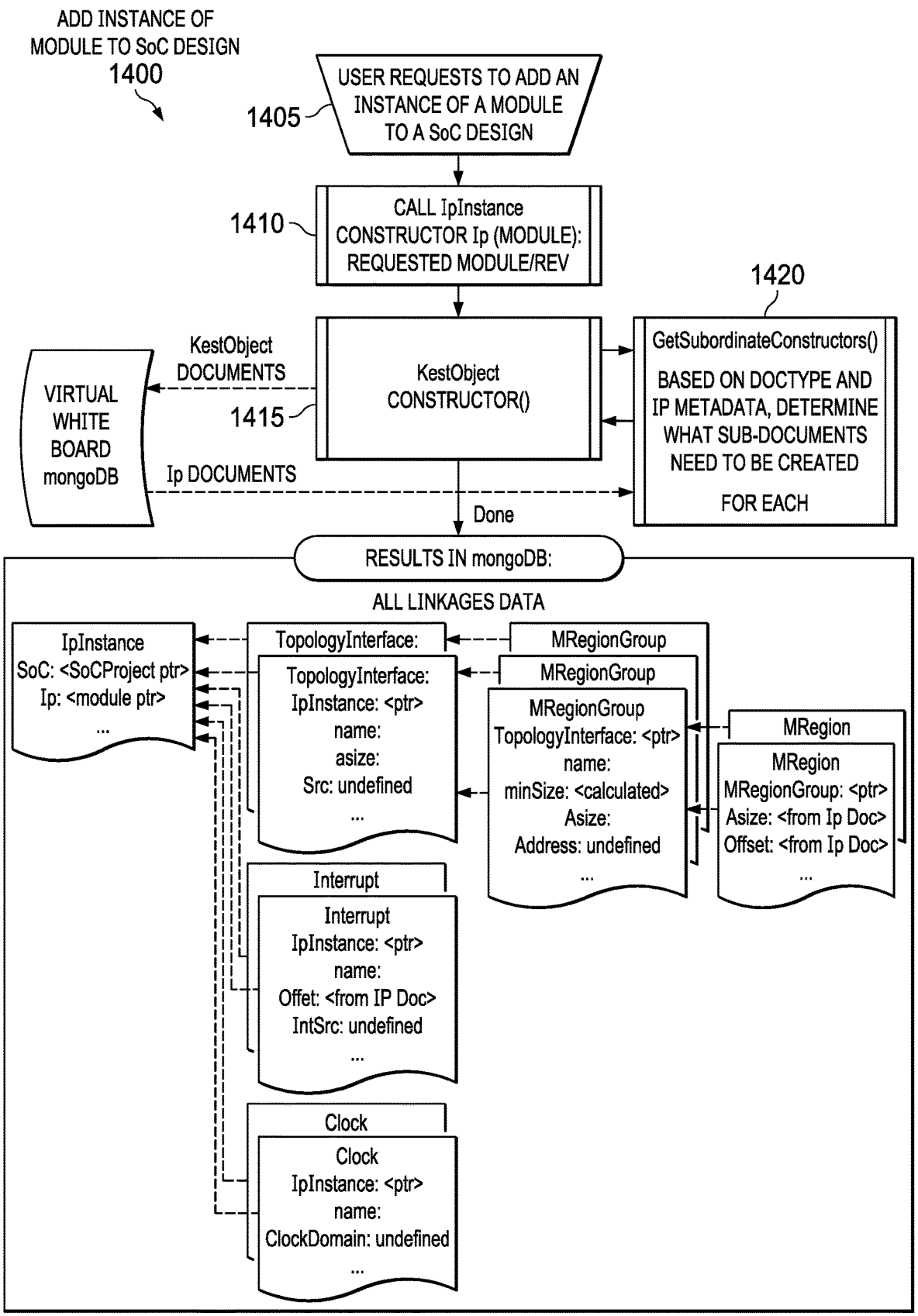
FIG. 14 illustrates flowchart 1400 representing one possible method for adding an instance of a module to an SoC design, according to one or more disclosed implementations.

FIG. 14 illustrates flowchart 1400 representing one possible method for adding an instance of a module to an SoC design, according to one or more disclosed implementations. Control lines and data flow lines are individually identified in flowchart 1400 as indicated in the legend. In general, Flow begins at block 1405 where a user can request to add an instance of a module to an SoC design. Block 1410 indicates that an IP instance constructor can retrieve required information for each data document associated with that IP instance module. For example, using KestObjectconstructor( ) block 1415. Importantly, block 1420 indicates that the GetSubordinateConstructors( )method may be used to determine what to create one level down by examining input and IP metadata. This process may be implemented in a recursive manner, with each new subordinate responsible for describing the next level in the hierarchy.

Figure 15:
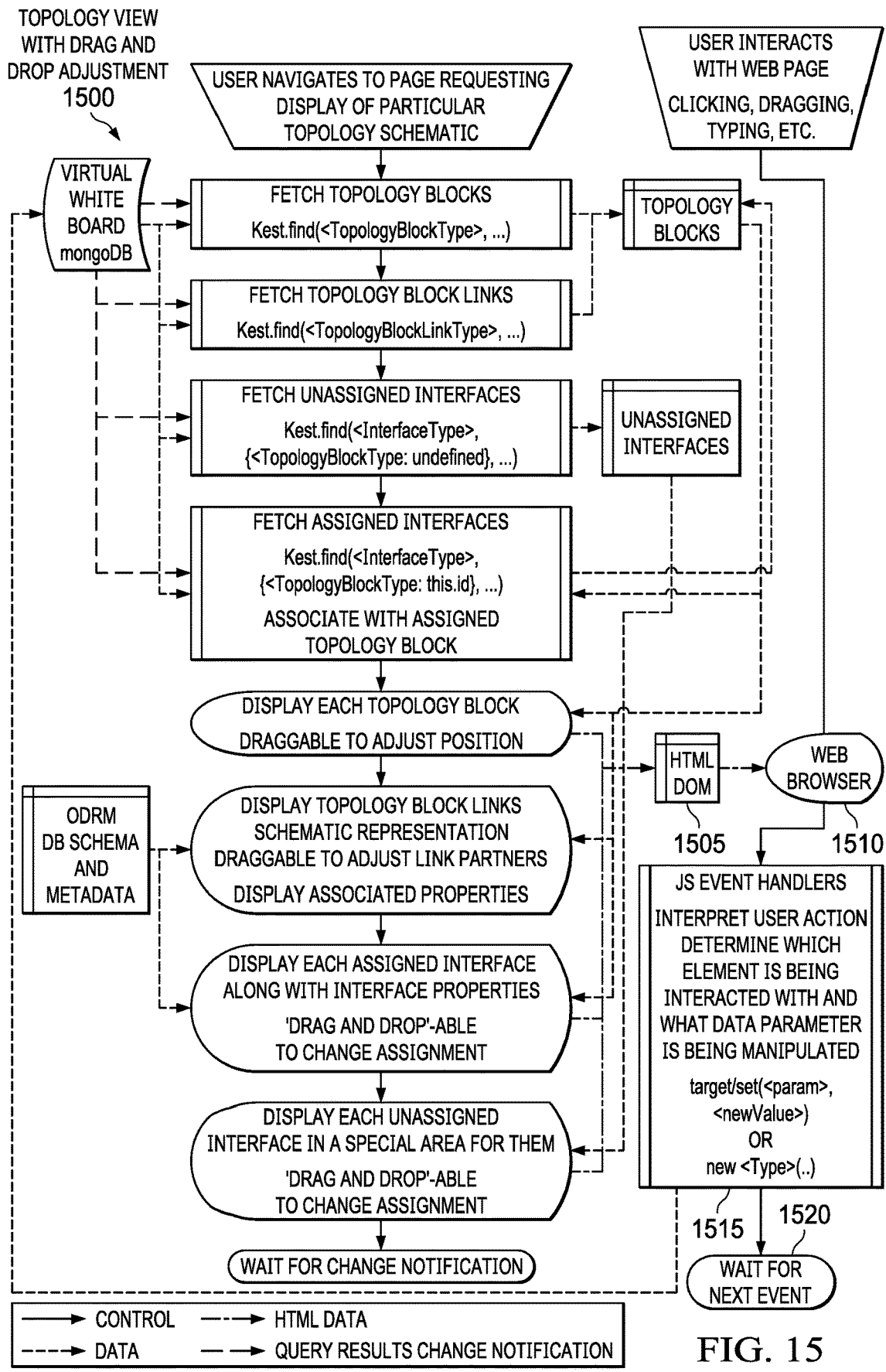
FIG. 15 illustrates flowchart 1500 representing one possible method for presenting, updating, and maintaining a topology layout for an SoC, according to one or more disclosed implementations.

Referring now to FIG. 15, flowchart 1500 representing one possible method for presenting, updating, and maintaining a topology layout for an SoC, according to one or more disclosed implementations. For example, VWB may present a drag and drop interface for a user to "re-position" a memory layout graphically such that VWB will then update the internal textual parameters (e.g., memory addresses, size) corresponding to the re-positioned memory block. In an example implementation of VWB, most assignments can be done graphically; including: Assigning/Moving endpoints to new SCRs (crossbars), creating new SCR links, assigning/moving clocks to new domains, pairing up directly connected master/slave interfaces, ordering lists (e.g. power domains). As shown at block 1505, data from the database of IP module information associated with a particular SoC (or portion thereof) is used to render a visualization into HTML and display it on a Web Browser 1510. Block 1515 indicates that event handlers are assigned to watch for user interaction (block 1520) and perform database updates as a result of a user's graphical alteration. The database updates are applied to attributes of the IP module information that was graphically manipulated by the user. After update, new information in the database can then drive the visualization updates to reflect the change caused by the user automatically (both on the presentation (e.g., refresh display) and in the data for each module instance of the SoC).

Figure 16:
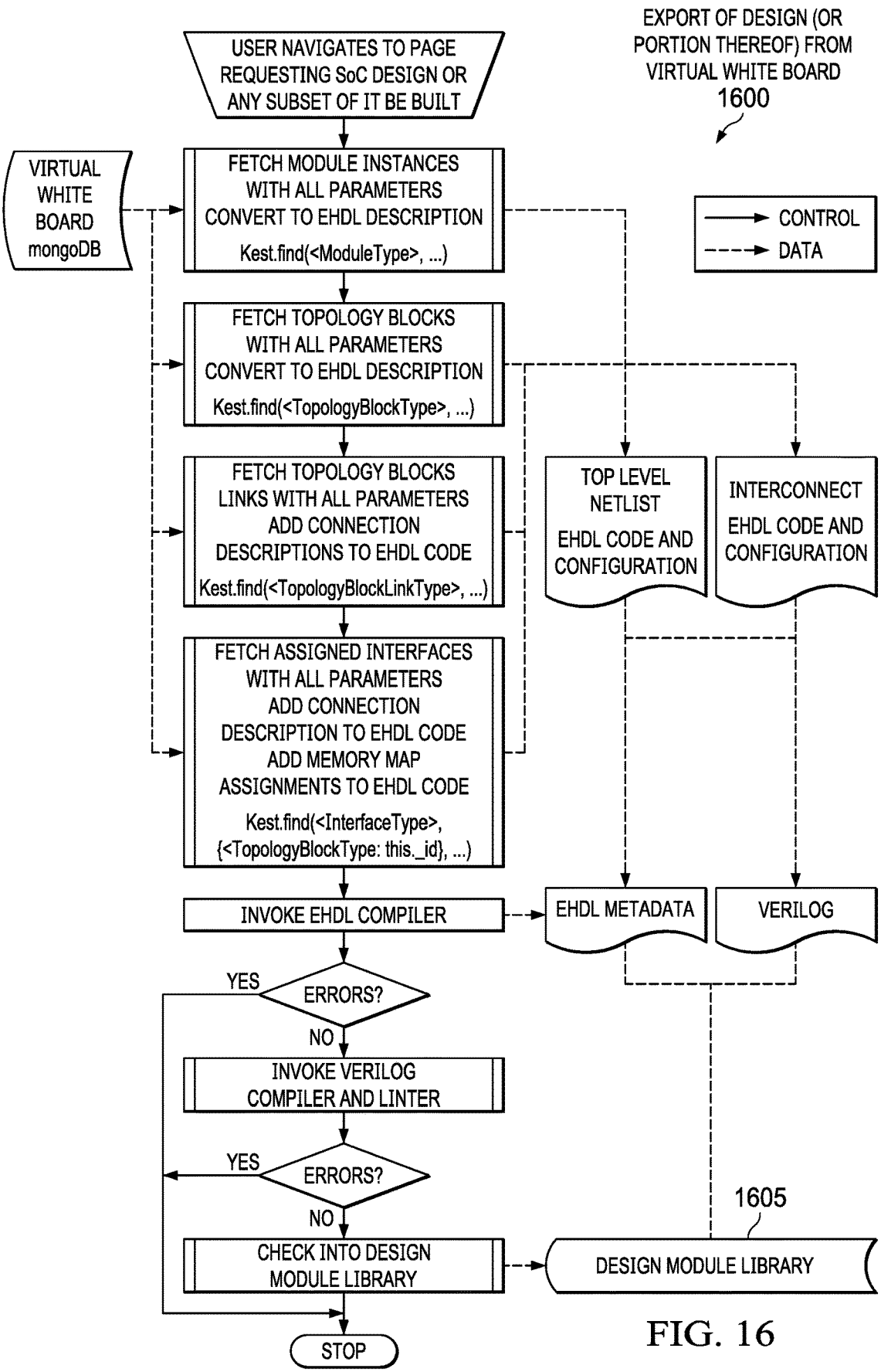
FIG. 16 illustrates flowchart 1600 representing one possible method for exporting design information (including connection parameters, netlist information, and interconnect information) for an SoC (or portion thereof), according to one or more disclosed implementations.

FIG. 16 illustrates flowchart 1600 representing one possible method for exporting design information (including connection parameters, netlist information, and interconnect information) for an SoC (or portion thereof), according to one or more disclosed implementations. As in FIGS. 13-15 discussed above, control and data lines are indicated differently in the diagram. Importantly, flowchart 1600 illustrates a process that uses the same database, render code, and control files underlying VWB that was input and adjusted by design engineers as discussed above. This definitional data is provided to an automated and scripted HDL build process with QC checks along to way to give feedback and ensure what is provided as output (and input into the design module library 1605) is accurate. In essence, data underlying VWB has become a fully functional "executable specification" for an SoC because VWB understands how to generate a design from that information.

In FIGS. 13-16 above, IP or module may refer to a building block for SoC design. A KestObject may refer to a base class in JavaScript for VWB classes that represent VWB data documents in one embodiment. "IpInstance" may refer to a document representing an instance of a specific revision of a specific module in a given SoC project. TopologyInterface may refer to a document representing a data interface of an IpInstance, for example one that uses address-based decode. MRegionGroup may be a collection of MRegions belonging to a TopologyInterface that have a fixed address offset to each other, but as a group can be assigned an address in the SoC memory map. MRegion may represent an addressable resource belonging to an MRegionGroup (and therefore also a TopologyInterface), such as one or more memory mapped registers (MMR), a memory space, etc. "Kest.find" may refer to an extension of a database query function (example: MongoDB) that is VWB datastructure aware.

While an SoC is primarily used throughout the above disclosure as an example type of chip, it will be appreciated that the techniques described herein may be applied in designing any type of IC chip. For instance, such IC chips may include a general-purpose or application-specific (ASIC) processor based upon x86, RISC, or other architectures, field-programmable gate array (FPGA), graphics processor (GPU), digital signal processor (DSP), a system-on-chip (SoC) processor, microcontroller, and/or related chip sets. By way of example only, the IC chip may be a model of a digital signal processor, an embedded processor, a SoC, or a microcontroller available from Texas Instruments Inc. of Dallas, Tex.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A computer-implemented method of integrated circuit (IC) chip design, comprising:
receiving an indication identifying a collaborative development project identifier for an integrated circuit at a design stage of a development lifecycle for the integrated circuit;
obtaining information from one or more databases, the information including metadata for a set of associated intellectual property (IP) modules included in the integrated circuit;

processing the metadata for the set of associated IP modules to determine physical relationship information relative to location and interconnection on the integrated circuit for a first IP module relative to a second IP module in the set of associated IP modules;

presenting a first graphical representation of at least a portion of a chip design of the integrated circuit on a first graphical user interface communicatively coupled to a first computer system;

analyzing an indication of a change from the first computer system regarding the first graphical representation;

migrating the change from the first computer system to a second graphical representation on a second graphical user interface communicatively couples to a second computer system;

when the change is inconsistent with the second graphical representation on the second graphical user interface, emphasizing the change with a visual cue on the second graphical user interface; and storing updates to at least a portion of the metadata in the one or more databases, the updates reflecting changes to attributes of the metadata consistent with the of change from the first graphical user interface.

2. The method of claim 1, wherein the indication of the change from the first graphical user interface represents an indication of change based on a drag and drop operation.

3. The method of claim 2, wherein the drag and drop operation represents an alteration of a memory map for at least one of the set of associated IP modules.

4. The method of claim 1, wherein the indication of the change from the first graphical user interface represents an indication of change reflecting addition of a module instance to the set of associated IP modules.

5. The method of claim 1, wherein the indication of the change from the first graphical user interface represents changing a revision of a module instance from a first revision identifier to a second revision identifier in the set of associated IP modules.

6. The method of claim 5, further including:
analyzing changes in interfaces between a first revision of the module instance and the second revision of the module instance to identify changed interfaces and consistent interfaces.

7. The method of claim 6, further including adding the visual clue to the changed interfaces in a dialog box.

8. The method of claim 6, further including not showing at least a portion of the consistent interfaces in a dialog box.

9. The method of claim 6, wherein the changed interfaces are selected from the group consisting of: interrupts, inputs, outputs, power requirements, ports, and communication busses.

10. The method of claim 1, further including:
generating a resistor transfer level (RTL) output representative of at least a portion of the integrated circuit;
performing a validation test using the RTL output; and
adjusting at least a portion of the metadata for the set of associated IP modules based on the validation test.

11. The method of claim 1, further including:
generating a comprehensive set of collaterals representing the integrated circuit, the set of collaterals including at least resistor transfer level (RTL) output, software code, verification, and test information.

12. A non-transitory computer readable medium comprising computer executable instructions stored thereon to cause one or more processing units to:

receive an indication identifying a collaborative development project identifier for an integrated circuit at a design stage of a development lifecycle for the integrated circuit;

obtain information from one or more databases, the information including metadata for a set of associated intellectual property (IP) modules included in the integrated circuit;

process the metadata for the set of associated IP modules to determine physical relationship information relative to location and interconnection on the integrated circuit for a first IP module relative to a second IP module in the set of associated IP modules;

present a first graphical representation of at least a portion of a chip design of the integrated circuit on a first graphical user interface communicatively coupled to a first computer system;

analyze an indication of a change from the first computer system regarding the first graphical representation;

migrate the change from the first computer system to a second graphical representation on a second graphical user interface communicatively coupled to a second computer system;

when the change is inconsistent with the second graphical representation on the second graphical user interface, emphasize the change with a visual cue on the second graphical user interface; and store updates to at least a portion of the metadata in the one or more databases, the updates reflecting changes to attributes of the metadata consistent with the change from the first graphical user interface.

13. The non-transitory computer readable medium of claim 12, wherein the indication of the change from the first graphical user interface represents an indication of change based on a drag and drop operation.

14. The non-transitory computer readable medium of claim 13, wherein the drag and drop operation represents an alteration of a memory map for at least one of the set of associated IP modules.

15. The non-transitory computer readable medium of claim 12, wherein the indication of the change from the first graphical user interface represents an indication of change reflecting addition of a module instance to the set of associated IP modules.

16. The non-transitory computer readable medium of claim 12, wherein the indication of the change from the first graphical user interface represents changing a revision of a module instance from a first revision identifier to a second revision identifier in the set of associated IP modules.

17. The non-transitory computer readable medium of claim 16, wherein the computer executable instructions further include instructions to cause the one or more processing units to:
analyze changes in interfaces between a first revision of the module instance and the second revision of the module instance to identify changed interfaces and consistent interfaces.

18. The non-transitory computer readable medium of claim 17, wherein the computer executable instructions further include instructions to add the visual clue to the changed interfaces in a dialog box.

19. The non-transitory computer readable medium of claim 17, wherein the computer executable instructions further include instructions to not show at least a portion of the consistent interfaces in a dialog box.

20. The non-transitory computer readable medium of claim 17, wherein the changed interfaces are selected from the group consisting of: interrupts, inputs, outputs, power requirements, ports, and communication busses.

21. The non-transitory computer readable medium of claim 12, wherein the computer executable instructions further include instructions to cause the one or more processing units to:
generate a resistor transfer level (RTL) output representative of at least a portion of the integrated circuit;
provide the RTL output to a validation test team;
receive information representative of a validation test performed by the validation test team; and
adjust at least a portion of the metadata for the set of associated IP modules based on the validation test.

22. An apparatus, comprising:
a network communications interface;
a memory; and
one or more processing units, communicatively coupled to the memory and the network communications interface, wherein the memory stores instructions configured to cause the one or more processing units to:
provide a collaborative development environment for one or more teams of end-users, the collaborative development environment containing code modules designed to understand attributes of integrated circuit chip design;
interface with one or more databases configured to store intellectual property (IP) information and related metadata about a set of associated IP modules included in a collaborative development project;
provide first graphical information, via the network communication interface, pertaining to at least a portion of the set of associated IP modules to a first device associated with an end-user;
analyze information from the first device relating to a change in functionality of at least one module from the set of associated IP modules;
migrate the change from the first device to second graphical information of a second device;
when the change is inconsistent with the second graphical information on the second device, emphasize the change with a visual cue on the second device; and
provide an indication of the change to the second device associated with members of a first team of the one or more teams of end-users, the first team not including the end-user.

23. The apparatus of claim 22, wherein the indication of the change includes an alert message containing information about the at least one module.

24. The apparatus of claim 22, wherein the first graphical information is provided via web browser.

25. The apparatus of claim 22, wherein the integrated circuit chip is a system on a chip (SoC).

* * * * *